United States Patent
Suganuma

(10) Patent No.: US 10,842,008 B2
(45) Date of Patent: Nov. 17, 2020

(54) LASER DEVICE, AND EXTREME ULTRAVIOLET LIGHT GENERATION SYSTEM

(71) Applicant: Gigaphoton Inc., Tochigi (JP)

(72) Inventor: Takashi Suganuma, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/261,313

(22) Filed: Jan. 29, 2019

(65) Prior Publication Data
US 2019/0157833 A1 May 23, 2019

Related U.S. Application Data

(63) Continuation of application No. PCT/JP2016/078074, filed on Sep. 23, 2016.

(51) Int. Cl.
*H05G 2/00* (2006.01)
*H01S 3/13* (2006.01)
(Continued)

(52) U.S. Cl.
CPC ......... *H05G 2/008* (2013.01); *G03F 7/70033* (2013.01); *H01S 3/0071* (2013.01);
(Continued)

(58) Field of Classification Search
None
See application file for complete search history.

(56) References Cited

U.S. PATENT DOCUMENTS

2010/0078577 A1  4/2010  Moriya et al.
2010/0117009 A1* 5/2010  Moriya ............... H01S 3/1305
                                                    250/504 R
(Continued)

FOREIGN PATENT DOCUMENTS

JP   2010-186735 A   8/2010
JP   2012-175006 A   9/2012
(Continued)

OTHER PUBLICATIONS

International Search Report issued in PCT/JP2016/078074; dated Nov. 29, 2016.
(Continued)

*Primary Examiner* — James Choi
(74) *Attorney, Agent, or Firm* — Studebaker & Brackett PC

(57) ABSTRACT

A laser device includes at least one amplification unit configured to amplify laser light emitted from a laser oscillator, and an amplification control unit configured to control the amplification unit. The amplification unit includes an incident-side optical adjustment unit including a wavefront adjustment unit configured to adjust a wavefront of the laser light and a first direction adjustment unit configured to adjust an optical axis thereof, an amplifier configured to amplify the laser light, an emission-side optical adjustment unit including a second direction adjustment unit configured to adjust an optical axis of the laser light, and a measurement unit configured to measure the laser light and acquire information on at least one of an optical axis, a wavefront and energy of the laser light. The amplification control unit controls the incident-side optical adjustment unit and/or the emission-side optical adjustment unit, based on a measurement result of the measurement unit.

14 Claims, 18 Drawing Sheets

(51) Int. Cl.
*H01S 3/10* (2006.01)
*H01S 3/23* (2006.01)
*H01S 3/00* (2006.01)
*G03F 7/20* (2006.01)

(52) U.S. Cl.
CPC .......... *H01S 3/1003* (2013.01); *H01S 3/1302* (2013.01); *H01S 3/1307* (2013.01); *H01S 3/2316* (2013.01); *H05G 2/00* (2013.01); *H01S 3/2366* (2013.01)

(56) References Cited

U.S. PATENT DOCUMENTS

| | | | |
|---|---|---|---|
| 2010/0193710 A1* | 8/2010 | Wakabayashi | B82Y 20/00 250/504 R |
| 2013/0037693 A1* | 2/2013 | Moriya | G02B 27/16 250/201.2 |
| 2013/0208742 A1 | 8/2013 | Mizoguchi et al. | |
| 2014/0348188 A1* | 11/2014 | Suganuma | H01S 3/2391 372/20 |
| 2015/0334814 A1 | 11/2015 | Moriya et al. | |
| 2016/0285222 A1 | 9/2016 | Suganuma et al. | |
| 2016/0316551 A1 | 10/2016 | Kurosawa | |

FOREIGN PATENT DOCUMENTS

| | | |
|---|---|---|
| JP | 2013-165256 A | 8/2013 |
| JP | 2013-201388 A | 10/2013 |
| WO | 2015/111510 A1 | 7/2015 |
| WO | 2015/118687 A1 | 8/2015 |

OTHER PUBLICATIONS

International Preliminary Report on Patentability and Written Opinion issued in PCT/JP2016/078074; dated Mar. 26, 2019.

An Office Action mailed by the Japanese Patent Office dated May 21, 2020, which corresponds to Japanese Patent Application No. 2018-540575 with English translation.

An Office Action mailed by the Japanese Patent Office dated May 21, 2020, which corresponds to Japanese Design Application No. 2018-540575 with English translation.

* cited by examiner

LASER DEVICE, AND EXTREME ULTRAVIOLET LIGHT GENERATION SYSTEM

CROSS-REFERENCE TO RELATED APPLICATIONS

The present application is a continuation application of International Application No. PCT/JP2016/078074 filed on Sep. 23, 2016. The content of the application is incorporated herein by reference in its entirety.

BACKGROUND

1. Technical Field

The present disclosure relates to a laser device and an extreme ultraviolet light generation system.

2. Related Art

In recent years, along with microfabrication in the semiconductor manufacturing process, fine transfer patterns in photolithography of the semiconductor manufacturing process are developed rapidly. In the next generation, microfabrication of 20 nm or smaller will be required. Accordingly, it is expected to develop an exposure device in which a device for generating extreme ultraviolet (EUV) light having a wavelength of about 13 nm and a reflection reduction projection optical system are combined.

As EUV light generation devices, three types of devices are proposed, namely, a laser produced plasma (LPP) type device that uses plasma generated when a target substance is irradiated with laser light, a discharge produced plasma (DPP) type device that uses plasma generated by discharging, and a synchrotron radiation (SR) type device that uses orbital radiation light.

CITATION LIST

Patent Literature

Patent Literature 1: Japanese Patent Application Laid-Open No. 2010-186735
Patent Literature 2: Japanese Patent Application Laid-Open No. 2013-165256
Patent Literature 3: Japanese Patent Application Laid-Open No. 2013-201388

SUMMARY

A laser device according to one aspect of the present disclosure includes at least one amplification unit and an amplification control unit. The amplification unit is configured to amplify laser light emitted from a laser oscillator. The amplification control unit is configured to control the amplification unit. The amplification unit includes an incident-side optical adjustment unit, an amplifier, an emission-side optical adjustment unit, and a measurement unit. Laser light is made incident on the incident-side optical adjustment unit. The incident-side optical adjustment unit includes a wavefront adjustment unit and a first direction adjustment unit. The wavefront adjustment unit is configured to adjust a wavefront of the laser light. The first direction adjustment unit is configured to adjust an optical axis of the laser light. The amplifier is disposed downstream the incident-side optical adjustment unit in a transmission direction of the laser light, and is configured to amplify the laser light emitted from the incident-side optical adjustment unit. The emission-side optical adjustment unit is disposed downstream the amplifier in the transmission direction of the laser light, and includes a second direction adjustment unit configured to adjust an optical axis of the laser light emitted from the amplifier. The measurement unit is disposed downstream the emission-side optical adjustment unit in the transmission direction of the laser light, and is configured to measure laser light emitted from the emission-side optical adjustment unit and acquire information on at least one of an optical axis, a wavefront and energy of the laser light. The amplification control unit controls at least one of the incident-side optical adjustment unit and the emission-side optical adjustment unit, based on a measurement result of the measurement unit.

An extreme ultraviolet light source system according to one aspect of the present disclosure is an extreme ultraviolet light source system for generating extreme ultraviolet light by irradiating a target substance with laser light to make the target substance into plasma. The system includes at least one amplification unit, an amplification control unit and an extreme ultraviolet light generation chamber. The amplification unit is configured to amplify laser light emitted from a laser oscillator. The amplification control unit is configured to control the amplification unit. The laser light emitted from the amplification unit is made incident on the extreme ultraviolet light generation chamber, and the extreme ultraviolet light is generated with use of the laser light in the extreme ultraviolet light generation chamber. The amplification unit includes an incident-side optical adjustment unit, an amplifier, an emission-side optical adjustment unit, and a measurement unit. The laser light is made incident on the incident-side optical adjustment unit. The incident-side optical adjustment unit includes a wavefront adjustment unit and a first direction adjustment unit. The wavefront adjustment unit is configured to adjust a wavefront of the laser light. The first direction adjustment unit is configured to adjust an optical axis of the laser light. The amplifier is disposed downstream the incident-side optical adjustment unit in a transmission direction of the laser light, and is configured to amplify the laser light emitted from the incident-side optical adjustment unit. The emission-side optical adjustment unit is disposed downstream the amplifier in the transmission direction of the laser light, and includes a second direction adjustment unit configured to adjust an optical axis of the laser light emitted from the amplifier. The measurement unit is disposed downstream the emission-side optical adjustment unit in the transmission direction of the laser light, and is configured to measure laser light emitted from the emission-side optical adjustment unit and acquire information on at least one of an optical axis, a wavefront and energy of the laser light. The amplification control unit controls at least one of the incident-side optical adjustment unit and the emission-side optical adjustment unit, based on a measurement result of the measurement unit.

BRIEF DESCRIPTION OF THE DRAWINGS

Some embodiments of the present disclosure will be described below as just examples with reference to the accompanying drawings.

EMBODIMENTS

Contents
1. Overall description of extreme ultraviolet light generation system
  1.1 Configuration
  1.2 Operation
2. Terms
3. Problem
4. Description of laser device
  4.1 Configuration
  4.2 Operation
  4.3 Flow of adjustment after replacement of components of amplification unit
    4.3.1 Flow of adjustment after replacement of amplification chamber
      4.3.1.1 Overall flowchart
      4.3.1.2 Description of optical axis direction and passage position scanning subroutine
      4.3.1.3 Description of optical axis direction and passage position measurement subroutine
      4.3.1.4 Description of optical axis optimum direction and optimum passage position determination subroutine
      4.3.1.5 Description of wavefront scanning subroutine
      4.3.1.6 Description of optimal wavefront determination subroutine
    4.3.2 Flow of adjustment after replacement of wavefront adjustment unit
    4.3.3 Flow of adjustment after replacement of measurement unit
    4.3.4 Flow of adjustment after replacement of first direction adjustment unit
    4.3.5 Flow of adjustment after replacement of second direction adjustment unit
  4.4 Exemplary configuration of wavefront adjustment unit
    4.4.1 First exemplary configuration
      4.4.1.1 Configuration
      4.4.1.2 Operation
    4.4.2 Second exemplary configuration
    4.4.3 Third exemplary configuration
    4.4.4 Fourth exemplary configuration
      4.4.4.1 Configuration
      4.4.4.2 Operation
  4.5 Exemplary configuration of direction adjustment unit
    4.5.1 Configuration
    4.5.2 Operation
  4.6 Exemplary configuration of measurement unit
    4.6.1 First exemplary configuration
      4.6.1.1 Configuration
      4.6.1.2 Operation
    4.6.2 Second exemplary configuration
      4.6.2.1 Configuration
      4.6.2.2 Operation
  4.7 Exemplar) configuration of energy meter
    4.7.1 First exemplary configuration
    4.7.2 Second exemplary configuration
    4.7.3 Third exemplary configuration
  4.8 Effect Hereinafter, embodiments of the present disclosure will be described in detail with reference to the drawings.

The embodiments described below illustrate some examples of the present disclosure, and do not limit the contents of the present disclosure. All of the configurations and the operations described in the embodiments are not always indispensable as configurations and operations of the present disclosure. The same constituent elements are denoted by the same reference signs, and overlapping description is omitted.

1. Overall Description of Extreme Ultraviolet Light Generation System

1.1 Configuration

Figure 1:
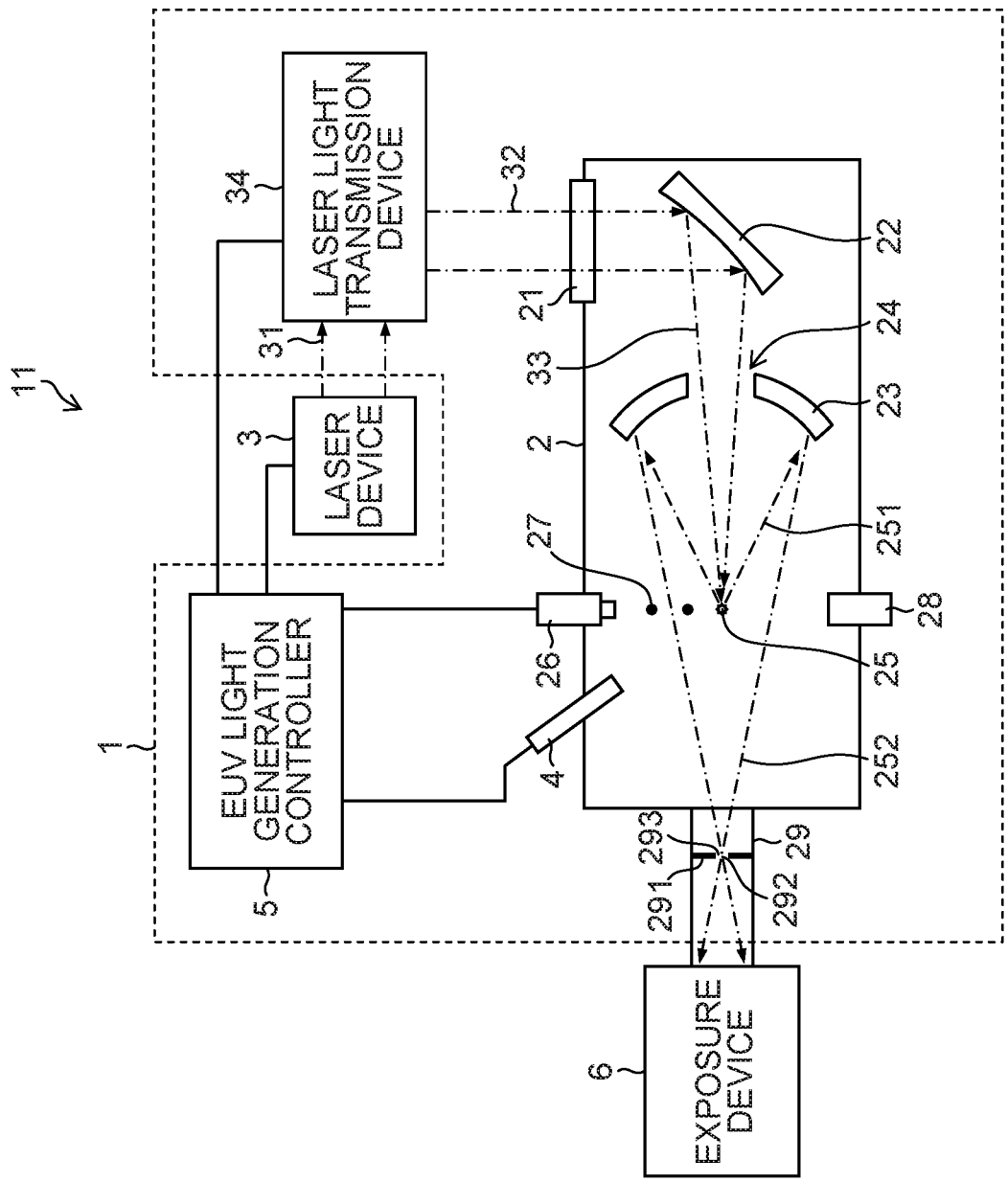
FIG. 1 is a diagram schematically illustrating a configuration of an exemplary LPP type EUV light generation system.

FIG. 1 schematically illustrates a configuration of an exemplary LPP type EUV light generation system. An EUV light generation device 1 may be used together with at least one laser device 3. In the present disclosure, a system including the EUV light generation device 1 and the laser device 3 is referred to as an EUV light generation system 11. As illustrated in FIG. 1 and described below in detail, the EUV light generation device 1 includes an EUV chamber 2 and a target feeding unit 26. The EUV chamber 2 is a sealable container. The target feeding unit 26 feeds a target substance into the EUV chamber 2, and is mounted so as to penetrate a wall of the EUV chamber 2, for example. The material of the target substance output from the target feeding unit 26 may include, but not limited to, tin, terbium, gadolinium, lithium, xenon, or a combination of any two or more of them.

At least one through hole is formed on a wall of the EUV chamber 2. The through hole is closed with a window 21 which transmits pulse laser light 32 output from the laser device 3. For example, an EUV light condensing mirror 23 having a spheroidal reflection surface is disposed in the EUV chamber 2. The EUV light condensing mirror 23 has first and second focuses. For example, a multilayer reflection film in which molybdenum and silicon are alternately layered is formed on the surface of the EUV light condensing mirror 23. The EUV light condensing mirror 23 may be disposed such that the first focus thereof is positioned in a plasma generation region 25 and the second focus thereof is positioned at an intermediate focusing point (IF) 292, for example. A center portion of the EUV light condensing mirror 23 has a through hole 24 through which pulse laser light 33 passes.

The EUV light generation device 1 includes an EUV light generation controller 5, a target sensor 4, and the like. The target sensor 4 detects any or a plurality of presence, trajectory, position, and velocity of the target 27. The target sensor 4 may have an imaging function.

The EUV light generation device 1 includes a connecting section 29 that allows the inside of the EUV chamber 2 and the inside of an exposure device 6 to communicate with each other. The inside of the connecting section 29 is provided with a wall 291 having an aperture 293. The wall 291 may be disposed such that the aperture 293 is positioned at the second focus position of the EUV light condensing mirror 23.

Further, the EUV light generation device 1 includes a laser light transmission device 34, a laser light condensing mirror 22, a target recovery unit 28 for recovering the target 27, and the like. The laser light transmission device 34 includes an optical element for defining a transmission state of the laser light, and an actuator for regulating the position, posture, and the like of the optical element.

1.2 Operation

Operation of an exemplary LPP type EUV light generation system will be described with reference to FIG. 1. The pulse laser light 31 having been output from the laser device 3 passes through the window 21 as pulse laser light 32 via the laser light transmission device 34, and enters the EUV chamber 2. The pulse laser light 32 travels inside the EUV chamber 2 along at least one laser light path, is reflected by the laser light condensing mirror 22, and is radiated to at least one target 27 as pulse laser light 33.

The target feeding unit 26 may output the target 27 made of the target substance toward the plasma generation region 25 in the EUV chamber 2. The target 27 is irradiated with at least one pulse included in the pulse laser light 33. The target 27 irradiated with the pulse laser light is made into plasma, and radiation light 251 is emitted from the plasma. EUV light 252 included in the radiation light 251 is selectively reflected by the EUV light condensing mirror 23. The EUV light 252 reflected by the EUV light condensing mirror 23 is condensed at the intermediate focusing point 292 and is output to the exposure device 6. One target 27 may be irradiated with a plurality of pulses included in the pulse laser light 33.

The EUV light generation controller 5 presides over the control of the entire EUV light generation system 11. The EUV light generation controller 5 processes a detection result of the target sensor 4. The EUV light generation controller 5 may control oscillation timing of the laser device 3, a radiation direction of the pulse laser light 32, and a condensing position of the pulse laser light 33, and the like, for example, based on the detection result of the target sensor 4. The aforementioned various types of control are mere examples. Other types of control may be added as required.

An extreme ultraviolet light source system that generates extreme ultraviolet light is a concept including the EUV light generation system 11. An extreme ultraviolet light generation chamber is a concept including the EUV chamber 2.

2. Terms

"Transmission direction of laser light" is a direction along a transmission path of laser light from a laser oscillator to an output end of a laser device.

"Upstream side of a transmission direction of laser light" is a side of the laser oscillator in the transmission path of the laser light.

"Downstream side of a transmission direction of laser light" is an output end side of the laser device in the transmission path of the laser light.

"Previous stage" is a position of an amplification unit or a device accompanying the amplification unit located at an immediately upstream side in the transmission direction of the laser light.

"Latter stage" is a position of the amplification unit or the device accompanying the amplification unit located at an immediately downstream side in the transmission direction of the laser light.

"Final stage" is a position of the amplification unit or the device accompanying the amplification unit located at the most downstream side in the transmission direction of the laser light.

"k-th" is an arbitrary position in the case where a position of the amplification unit or a device accompanying the amplification unit located at the uppermost stream side in the transmission direction of the laser light is assumed to be the 1st. When n pieces of amplification units are included, k is an arbitrary integer of 1 or larger but n or smaller.

"Incident side of an amplification chamber" is an upstream side of the amplification chamber in the transmission direction of the laser light.

"Emission side of an amplification chamber" is a downstream side of the amplification chamber in the transmission direction of the laser light.

"Beam width" is a width in a cross section of the laser light. When a cross section of the laser light is a circle, the beam width is a diameter of the circle.

3. Problem

Figure 2:
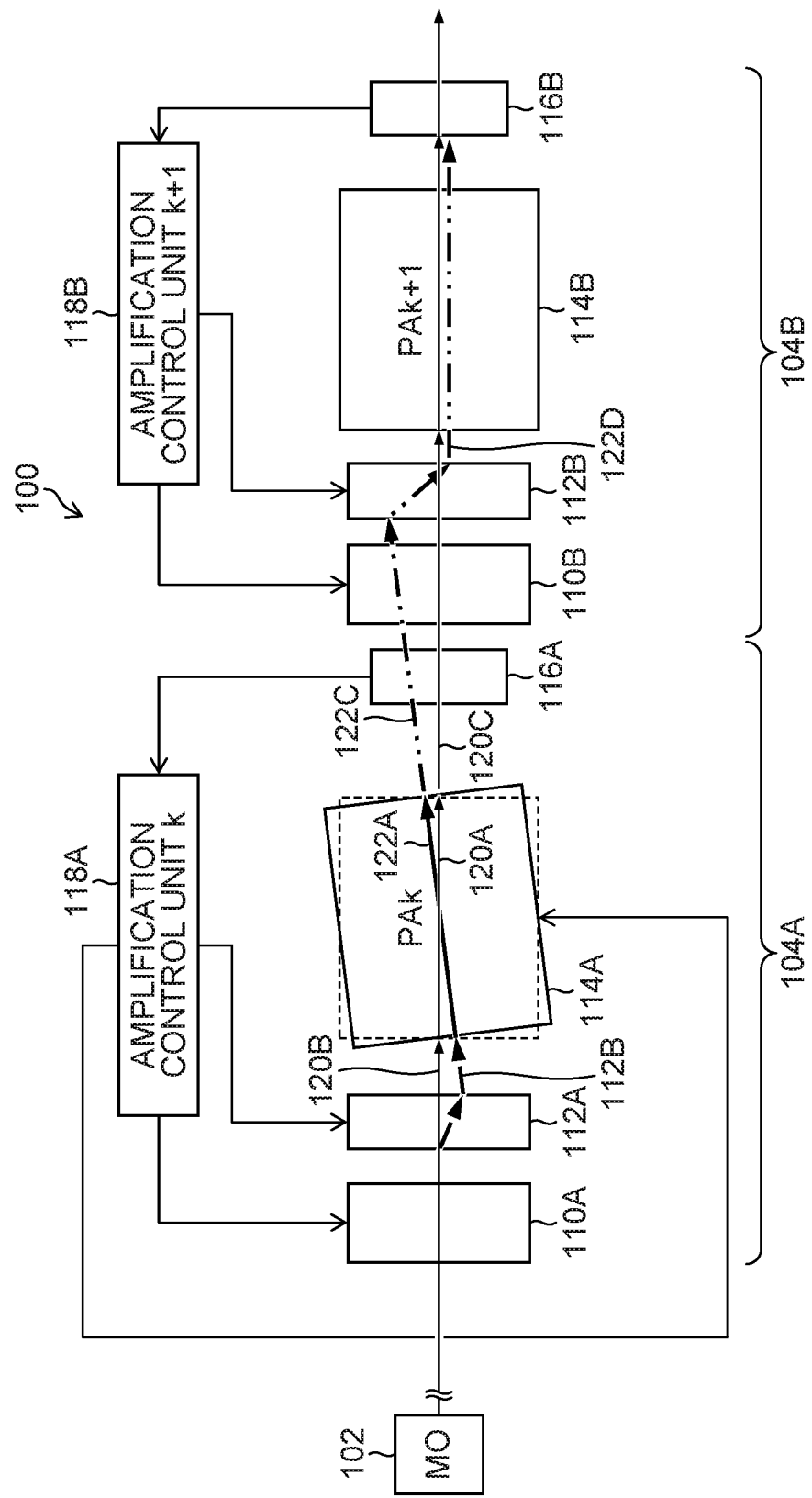
FIG. 2 is a diagram schematically illustrating adjustment of an optical axis of laser light when an amplification chamber according to a comparative example is replaced.

FIG. 2 is a diagram schematically illustrating adjustment of an optical axis of laser light when an amplification chamber according to a comparative example is replaced. A laser device 100 according to a comparative example includes a laser oscillator 102, and n pieces of amplification units 104. Here, n represents 1 or larger integer. The n pieces of amplification units 104 are arranged in series along a transmission direction of pulse laser light. Hereinafter, pulse laser light may be described as laser light.

FIG. 2 illustrates the k-th amplification unit 104A and the (k+1)-th amplification unit 104B among the n pieces of amplification units 104, when an amplification unit nearest to the laser oscillator 102 is assumed to be the first amplification unit 104.

The k-th amplification unit 104A includes a wavefront adjustment unit 110A, a direction adjustment unit 112A, an amplification chamber 114A, and a measurement unit 116A. The wavefront adjustment unit 110A, the direction adjustment unit 112A, the amplification chamber 114A, and the measurement unit 116A are disposed in the order described above from the upstream side in the transmission direction of the laser light along the transmission direction of the pulse laser light.

The wavefront adjustment unit 110A, the direction adjustment unit 112A, the amplification chamber 114A, and the measurement unit 116A are connected with the amplification control unit 118A so as to be able to transmit an electric signal. The (k+1)-th amplification unit 104B has the same configuration as that of the k-th amplification unit 104A, and the description thereof is not repeated here. Reference numerals of the respective components of the amplification unit 104B are illustrated in such a manner that B is attached to the end thereof.

Here, MO given to the laser oscillator 102 in FIG. 2 is an abbreviation for master oscillator. Also, PA given to the amplification chamber 114 in FIG. 2 is an abbreviation for power amplifier.

In the amplification unit 104A illustrated in FIG. 2, the laser light having been emitted from the laser oscillator 102 is made incident on the amplification chamber 114A via the wavefront adjustment unit 110A and the direction adjustment unit 112A. The measurement unit 116A measures the laser light emitted from the amplification chamber 114A. The amplification control unit 118A controls the wavefront adjustment unit 110A and the direction adjustment unit 112A, based on information of the optical axis and wavefront information of the laser light measured with use of the measurement unit 116A.

The amplification chamber 114A illustrated with use of a broken line in FIG. 2 represents the amplification chamber 114A before replacement when the amplification chamber 114A is replaced. The amplification chamber 114A illustrated using a solid line in FIG. 2 represents the amplification chamber 114A after the replacement.

In FIG. 2, a reference numeral of each component of the amplification unit 104 is attached with an alphabet that is the same as that given to the reference numeral of the amplification unit. In the below description, when no alphabet is given to the reference numeral of an amplification unit and each component thereof, it represents a generic term or any one of them.

Before the amplification chamber 114A is replaced, an optical axis 120B of the laser light made incident on the amplification chamber 114A is adjusted according to an optimum optical axis 120A in the amplification chamber 114A.

For example, when the amplification chamber 114A is replaced, a position where the amplification chamber 114A is disposed after the replacement may be deviated. In that case, an optimum optical axis 122A of the amplification chamber 114A after the replacement may be deviated from the optimum optical axis 120A of the amplification chamber 114A before the replacement.

Then, an optical axis 122C of the laser light emitted from the amplification chamber 114A after the replacement may be deviated from an optimum optical axis 120C of the amplification chamber 114B disposed in the latter stage of the amplification chamber 114A.

Therefore, it is necessary to adjust the optical axis of the laser light by using the direction adjustment unit 112B in the latter stage, to compensate for the deviation of the optical axis of the laser light before and after the replacement so that the laser light enters the subsequent amplification chamber 114B in the latter stage with the optical axis 120C that is an optical axis before the amplification chamber 114A of the previous stage is replaced.

In that case, when the amplification chamber 114A is replaced, it is necessary to adjust the optical axis to control the direction adjustment unit 112B by the amplification control unit 118B in the latter stage, after adjusting the optical axis and the wavefront by controlling the wavefront adjustment unit 110A and the direction adjustment unit 112A by the amplification control unit 118A. Therefore, it takes a long time for adjustment after the replacement.

Figure 3:
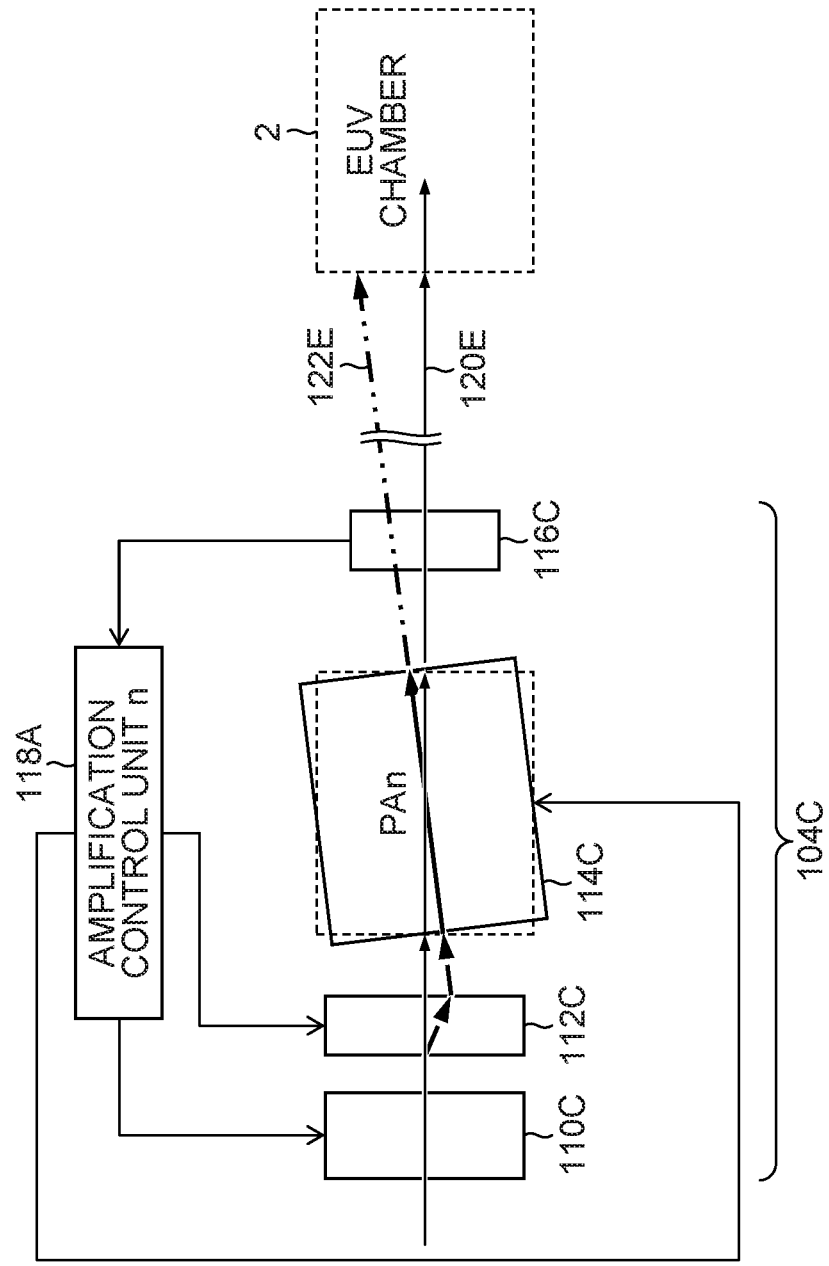
FIG. 3 is a diagram schematically illustrating optical axes before and after replacement of an amplification chamber in a final stage according to the comparative example.

FIG. 3 is a diagram schematically illustrating an optical axis before and after replacement of an amplification chamber in the final stage, according to the comparative example. An amplification unit 104C illustrated in FIG. 3 includes a wavefront adjustment unit 110C, a direction adjustment unit 112C, an amplification chamber 114C, and a measurement unit 116C. This is equivalent to the case where n is 1.

The wavefront adjustment unit 110C, the direction adjustment unit 112C, the amplification chamber 114C, and the measurement unit 116C are connected with the amplification control unit 118C so as to be able to transmit an electric signal.

As illustrated in FIG. 3, the laser light emitted from the amplification unit 104C in the final stage is guided to the EUV chamber 2 via the laser light transmission device 34 illustrated in FIG. 1. However, an optical axis 122E of the laser light emitted from the amplification chamber 114C after replacement may be deviated from the optical axis 120E of the laser light emitted from the amplification chamber 114C before replacement.

That is, when the amplification chamber 114C is replaced, the laser light emitted from the amplification chamber 114C may not enter the EUV chamber 2.

4. Description of Laser Device 4.1 Configuration

Figure 4:
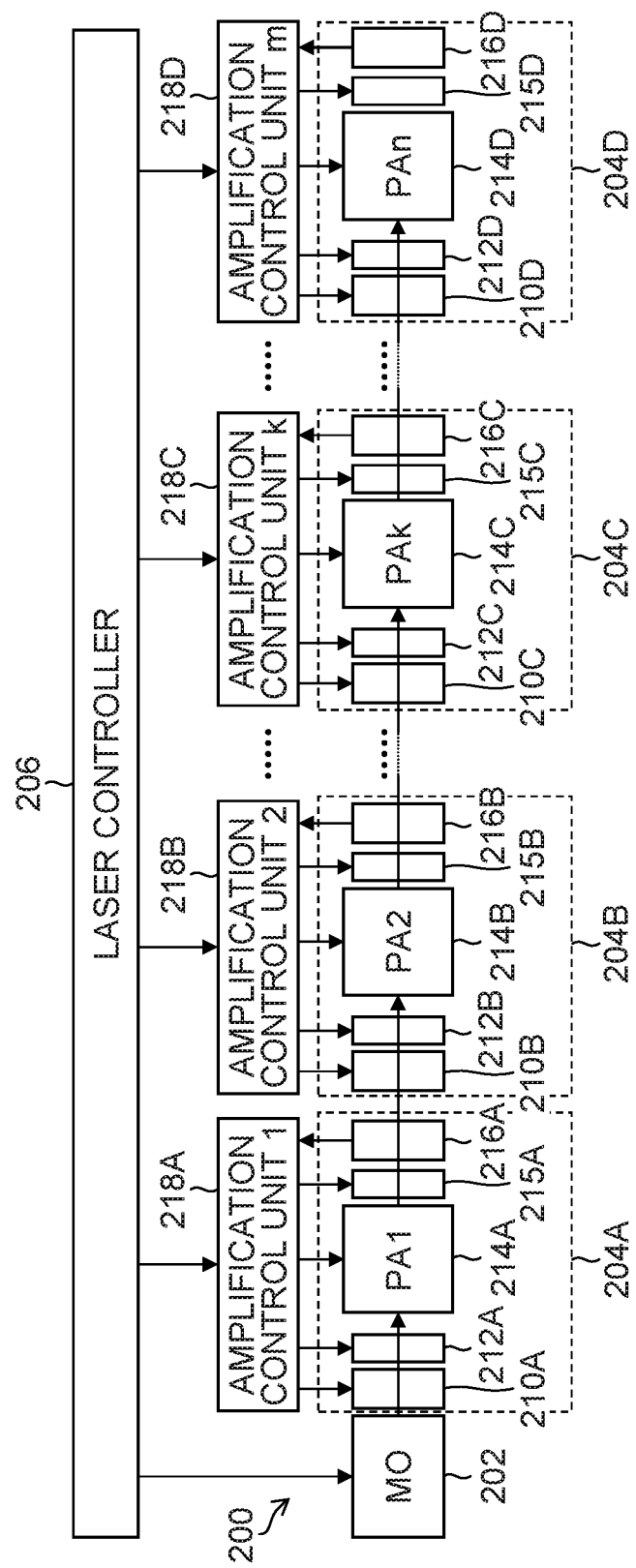
FIG. 4 is a block diagram schematically illustrating an exemplary configuration of a laser device according to an embodiment.

FIG. 4 is a block diagram schematically illustrating an exemplary configuration of a laser device according to the present embodiment. The laser device described below is applicable to an EUV light generation system. A laser device 200 illustrated in FIG. 4 includes a laser oscillator 202, and m pieces of amplification units 204. The m pieces of amplification units 204 illustrated in FIG. 4 are arranged in series along a transmission direction of laser light. Here, m represents 1 or larger integer.

The laser device 200 is connected with a laser controller 206 and m pieces of amplification control units 218 so as to be able to transmit an electric signal. The laser controller 206 illustrated in FIG. 4 may be provided to the EUV light generation controller 5 illustrated in FIG. 1, or may be provided separately from the EUV light generation controller 5.

The amplification unit 204A illustrated in FIG. 4 includes a wavefront adjustment unit 210A, a first direction adjustment unit 212A, an amplification chamber 214A, a second direction adjustment unit 215A, and a measurement unit 216A. The wavefront adjustment unit 210A, the first direction adjustment unit 212A, the amplification chamber 214A, the second direction adjustment unit 215A, and the measurement unit 216A are disposed in the order described above from the upstream side in the transmission direction of the laser light along the transmission direction of the laser light.

That is, the first direction adjustment unit 212A is disposed at a position upstream in the transmission direction of the laser light, and the second direction adjustment unit 215A is disposed at a position downstream in the transmission direction of the laser light, in the amplification unit 204A illustrated in FIG. 4.

The second direction adjustment unit 215A is disposed at a position where the laser light emitted from the amplification chamber 214A is directly made incident thereon. Further, the second direction adjustment unit 215A is disposed at a position where the laser light emitted from the second direction adjustment unit 215A is directly made incident on the measurement unit 216A.

The amplification unit 204B, the amplification unit 204C, and the amplification unit 204D illustrated in FIG. 4 are also configured similarly to the amplification unit 204A. The amplification unit 204D illustrated in FIG. 4 outputs laser light that is made incident on the EUV chamber 2, via the laser light transmission device 34 illustrated in FIG. 1.

An incident-side optical adjustment unit may include a wavefront adjustment unit and a first direction adjustment unit as constituent elements. An emitting-side optical adjustment unit may include a second direction adjustment unit as a constituent element. An amplifier is a concept including an amplification chamber. The m pieces of amplifier control units illustrated in FIG. 4 may be configured of m pieces of processors, or configured of one or more but less than m pieces of processors. The m pieces of amplifier control units may be integrated with a laser controller.

4.2 Operation

Figure 5:
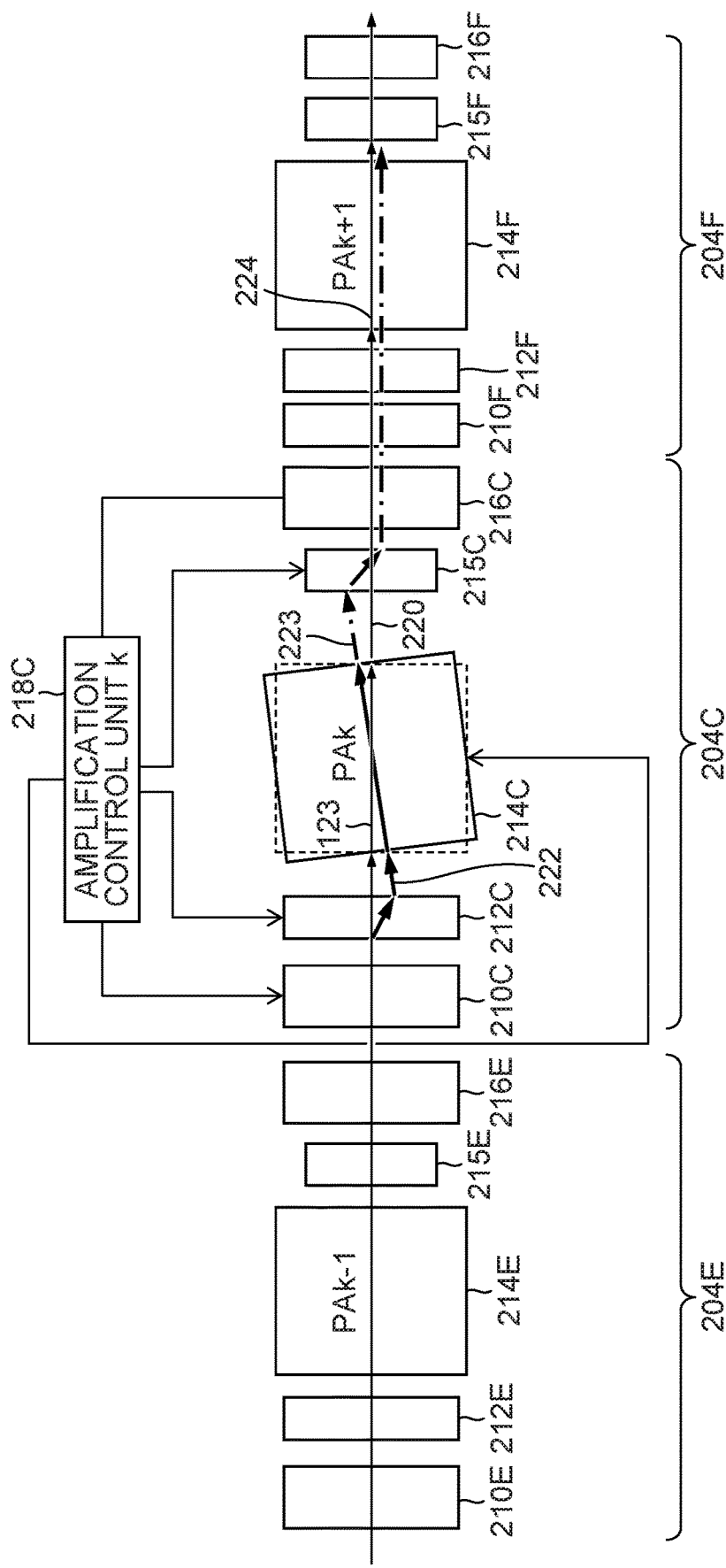
FIG. 5 is a diagram schematically illustrating optical axes of laser light before and after replacement of an amplification chamber.

FIG. 5 is a diagram schematically illustrating an optical axis of laser light before and after replacement of an amplification chamber. FIG. 5 illustrates an amplification unit 204C provided with an amplification chamber 214C to be replaced, an amplification unit 204E in the previous stage of the amplification unit 204C, and an amplification unit 204F in the latter stage of the amplification unit 204C. The amplification chamber 214C illustrated by a broken line represents the amplification chamber 214C before replacement.

The amplification unit 204C illustrated in FIG. 5 is the k-th amplification unit 204. The amplification unit 204E illustrated in FIG. 5 is the (k−1)-th amplification unit 204. The amplification unit 204F illustrated in FIG. 5 is the (k+1)-th amplification unit 204.

When the amplification chamber 214C is replaced, optical axis adjustment and wavefront adjustment of the laser light made incident on the amplification chamber 214C, and optical axis adjustment of the laser light emitted from the amplification chamber 214C are performed, in accordance with the position where the amplification chamber 214C is disposed.

First, the amplification chambers up to the previous stage of the amplification chamber 214C after the replacement are excited, whereby the laser light is made incident on the amplification chamber 214C after the replacement. An optical axis 222 of the laser light made incident on the amplification chamber 214C is adjusted according to an optimum optical axis 223 of the amplification chamber 214C after the replacement, with use of the first direction adjustment unit 212C disposed on the incident side of the amplification chamber 214C after the replacement.

Further, a wavefront of the laser light made incident on the amplification chamber 214C is adjusted according to an optimum wavefront of the amplification chamber 214C after the replacement, with use of the wavefront adjustment unit 210C disposed on the incident side of the amplification chamber 214C after the replacement.

Next, the optical axis 223 of the laser light emitted from the amplification chamber 214C is adjusted to conform to an optimum optical axis 224 of the amplification chamber 214F, with use of the second direction adjustment unit 215C disposed on the emission side of the amplification chamber 214C. The optimum optical axis 224 of the amplification chamber 214F is identical to the optimum optical axis 220 before the replacement of the amplification chamber 214C in the previous stage. In other words, the optimum optical axis 220 before the replacement of the amplification chamber 214C is restored. In FIG. 5, the optical axis 220 and the optical axis 224 are illustrated such that the positions thereof are deviated from each other, for the convenience of illustration. "Identical" in this context may include substantially identical including an allowable tolerance.

When the amplification chamber 214C is replaced, and adjustment of the optical axis and the wavefront after the replacement is completed, the laser device 200 is in an operable state. During operation of the laser device 200, it is possible to control the wavefront adjustment unit 210C, the first direction adjustment unit 212C, and the second direction adjustment unit 215C while keeping a target value before the replacement of the amplification chamber 214C.

Figure 6:
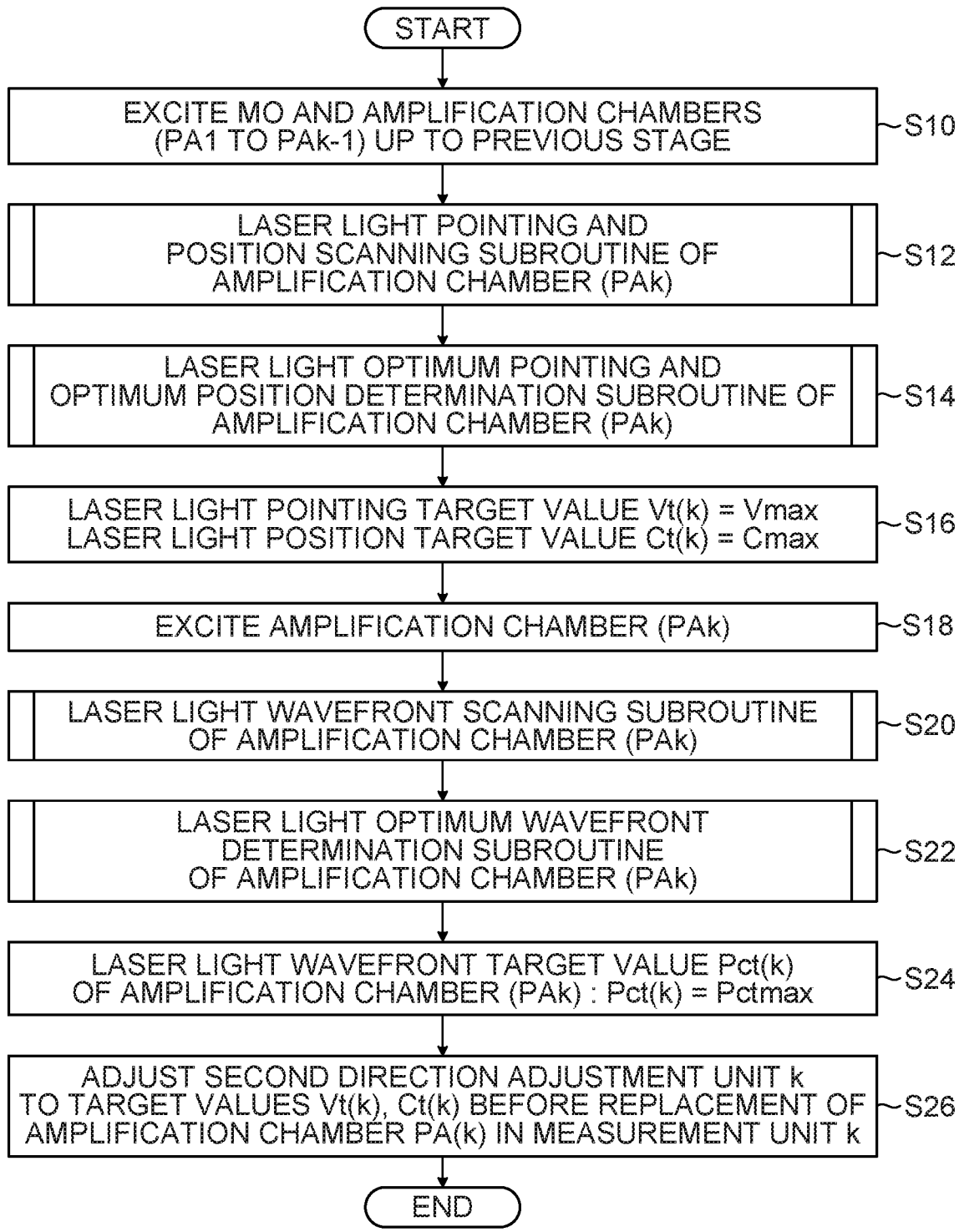
FIG. 6 is a flowchart illustrating a flow of adjustment when an amplification chamber is replaced.

4.3 Flow of Adjustment after Replacement of Components of Amplification Unit 4.3.1 Flow of Adjustment after Replacement of Amplification Chamber 4.3.1.1 Overall Flowchart Hereinafter, description is provided on the case where each component provided to the k-th amplification unit 204C illustrated in FIGS. 4 and 5 is replaced. FIG. 6 is a flowchart illustrating a flow of adjustment when an amplification chamber is replaced.

When the amplification chamber 214C illustrated in FIG. 4 is replaced, the amplification control unit 218C illustrated in FIG. 4 excites the laser oscillator 202 at step S10 of FIG. 6.

Further, the amplification control unit 218C excites the amplification units 204 up to the previous stage of the amplification unit 204C to be adjusted at step S10 of FIG. 6. When the adjustment target amplification unit 204 is the first amplification unit 204A, only the laser oscillator 202 is excited.

At step S12 of FIG. 6, an optical axis direction and passage position scanning subroutine is performed. At step S12, the amplification control unit 218C performs scanning of the direction of the laser light passing through the amplification chamber 214C and the passage position of the optical axis, in a state where the amplification chamber 214C is not excited. In FIG. 6, the direction of the optical axis is described as pointing. Further, the passage position of the optical axis is described as position.

An optical axis of the laser light may be a straight line passing through the center of gravity of the intensity distribution in a cross section of the beam at a plurality of positions on the optical path of the laser light. When the beam cross section is a circle, the optical axis of the laser light may be a straight line passing through the center of the beam cross section at a plurality of positions on the optical path of the laser light.

At step S14, an optical axis optimum direction and optimum passage position determination subroutine is performed. At step S14, the amplification control unit 218C illustrated in FIG. 4 determines an optimum optical axis of the laser light made incident on the amplification chamber 214C. That is, the amplification control unit 218C determines an optimum value Vmax representing an optimum direction of the optical axis of the laser light, and an optimum value Cmax representing an optimum passage position of the optical axis of the laser light. At step S16, the amplification control unit 218C determines a target value Vt(k) of the direction of the optical axis of the laser light, and a target value Ct(k) of the passage position of the optical axis of the laser light. Here, a parameter k represents the k-th. The amplification control unit 218C illustrated in FIG. 4 adjusts the optical axis of the laser light made incident on the amplification control unit 218C with use of the determined target value Vt(k) and the determined target value Ct(k).

The target value Vt(k) of the direction of the optical axis of the laser light may be the optimum value Vmax of the direction of the optical axis of the laser light that is determined at step S14. The target value Ct(k) of the passage position of the optical axis of the laser light may be the optimum value Cmax of the passage position of the optical axis of the laser light that is determined at step S14.

At step S18, the amplification control unit 218C illustrated in FIG. 4 excites the amplification chamber 214C. At step S20 of FIG. 6, a wavefront scanning subroutine is performed based on the premise that the optical axis adjustment illustrated in steps S12 to S16 has been performed. At step S20, the amplification control unit 218C illustrated in FIG. 4 performs scanning of the wavefront of the laser light emitted from the amplification chamber 214C in a state where the amplification chamber 214C is excited.

At step S22 of FIG. 6, an optimum wavefront determination subroutine is performed. At step S22, the amplification control unit 218C illustrated in FIG. 4 determines an optimum wavefront of the laser light made incident on the amplification chamber 214C. At step S24 of FIG. 6, the amplification control unit 218C illustrated in FIG. 4 determines a target value Pct(k) of the wavefront of the laser light made incident on the amplification chamber 214C. The target value Pct(k) of the wavefront of the laser light to be made incident on the amplification chamber 214C may be an optimum value Pctmax of the wavefront of the laser light that is determined at step S22 of FIG. 6. At step S22, the amplification control unit 218C illustrated in FIG. 4 adjusts the wavefront of the laser light made incident on the amplification control unit 218C with use of the determined target value Pct(k).

At step S26, the amplification control unit 218C illustrated in FIG. 4 adjusts the second direction adjustment unit 215, according to the target value Vt(k) of the direction of the optical axis of the laser light and the target value Ct(k) of the passage position of the optical axis of the laser light before the amplification chamber 214C is replaced.

This means that the second direction adjustment unit 215 is adjusted while keeping the target value Vt(k) of the direction of the optical axis of the laser light and the target value Ct(k) of the passage position of the optical axis of the laser light before the amplification chamber 214C illustrated in FIG. 4 is replaced, at step S26. When step S26 ends, optical axis adjustment and wavefront adjustment when the amplification chamber 214C has been replaced, end.

Figure 7:
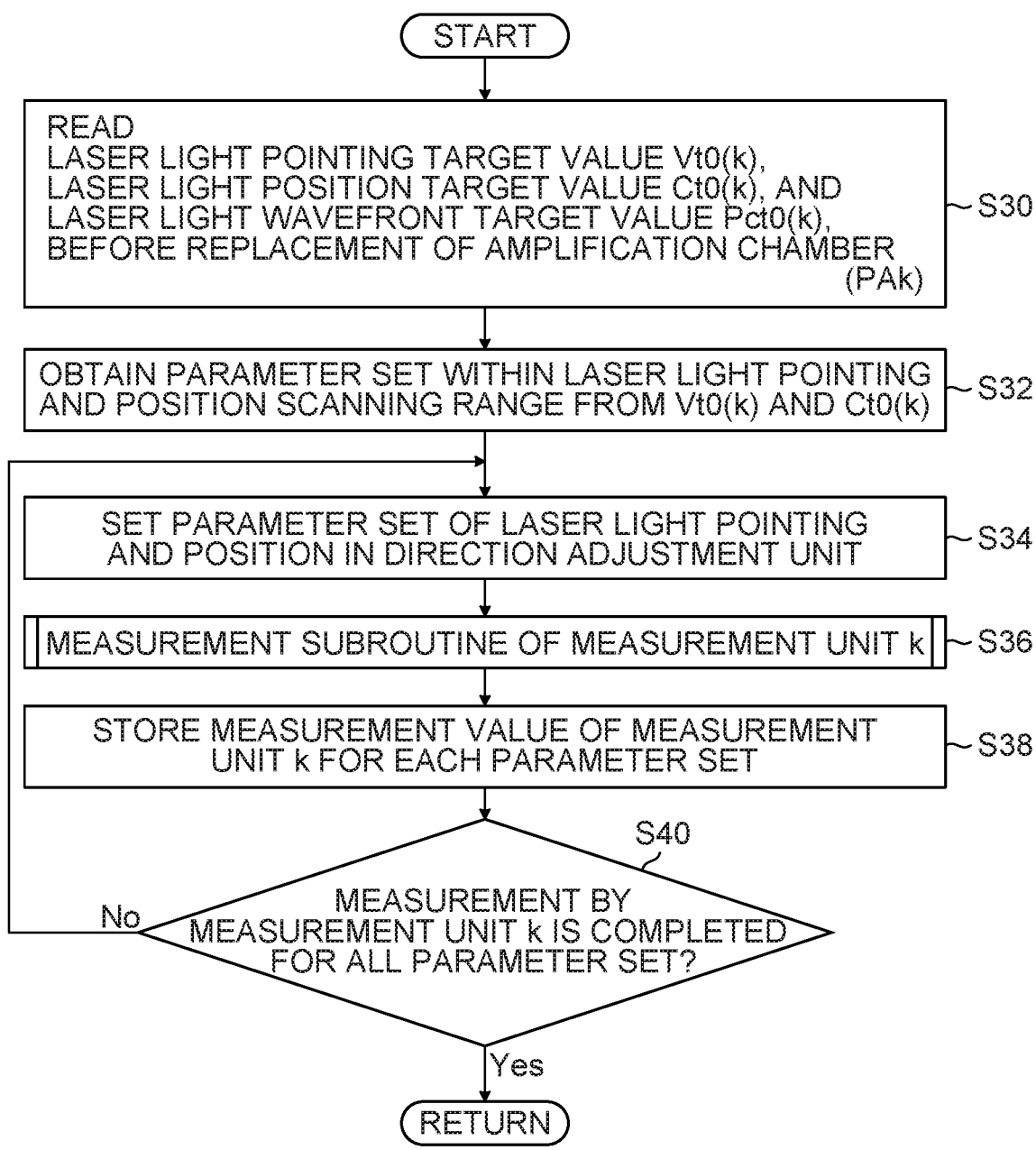
FIG. 7 is a flowchart illustrating a flow of an optical axis direction and passage position scanning subroutine illustrated in FIG. 6.

4.3.1.2 Description of Optical Axis Direction and Passage Position Scanning Subroutine FIG. 7 is a flowchart illustrating a flow of the optical axis direction and passage position scanning subroutine illustrated in FIG. 6. At step S30 of FIG. 7, the amplification control unit 218C illustrated in FIG. 4 reads out the target value Vt0(k) of the direction of the optical axis of the laser light and the target value Ct0(k) of the passage position of the optical axis of the laser light before the amplification chamber 214C is replaced.

Further, at step S30 of FIG. 7, the amplification control unit 218C illustrated in FIG. 4 reads out the target value Pct0(k) of the wavefront of the laser light before the amplification chamber 214C is replaced. The target value Vt0(k) of the direction of the optical axis of the laser light, the target value Ct0(k) of the passage position of the optical axis of the laser light, and the target value Pct0(k) of the wavefront of the laser light are stored in a storage unit not illustrated.

At step S32, the amplification control unit 218C illustrated in FIG. 4 obtains a scanning range of the direction and the passage position of the optical axis, with use of the target value Vt0(k) of the direction of the optical axis of the laser light and the target value Ct0(k) of the passage position of the optical axis of the laser light. The scanning range includes one or more parameter sets. A parameter set is a set of values each indicating a direction of one optical axis and one passage position.

When there is an arrangement tolerance range of the amplification chamber 214C, the scanning range of the direction and the passage position of the optical axis may be obtained based on the arrangement tolerance range of the amplification chamber 214C. When the first direction adjustment unit 212C has a configuration illustrated in FIG. 20, the scanning range obtained at step S32 of FIG. 7 may be a four-dimensional matrix using two degrees of freedom of the direction of the optical axis and two degrees of freedom of the passage position.

At step S34, the amplification control unit 218C illustrated in FIG. 4 sets a parameter set of the scanning range of the direction and the passage position of the optical axis, in the first direction adjustment unit 212C illustrated in FIG. 4. Here, the parameter set of the scanning range of the direction and the passage position of the optical axis is a four-dimensional matrix with use of the direction of the optical axis of the laser light and the passage position of the optical axis of the laser light.

At step S36 of FIG. 7, an optical axis direction and the passage position measurement subroutine is performed. At step S36, the amplification control unit 218C illustrated in FIG. 4 performs measurement for each parameter set by using the measurement unit 216C illustrated in FIG. 4. At step S38 of FIG. 7, the amplification control unit 218C illustrated in FIG. 4 stores a measurement result obtained by using the measurement unit 216C for each parameter set.

At step S40 of FIG. 7, the amplification control unit 218C determines whether or not the measurement using the measurement unit 216C is completed for all parameter sets. At step S40 of FIG. 7, when the measurement using the measurement unit 216C is not completed for all parameter sets, it is determined to be No. When it is determined to be No at step S40, the processing proceeds to step S34. Thereafter, the respective processes from step S34 to step S40 are repeated until it is determined to be Yes at step S40.

On the other hand, when the measurement using the measurement unit 216C is completed for all parameter sets, it is determined to be Yes at step S40. When it is determined to be Yes at step S40, the optical axis direction and passage position scanning subroutine ends.

Figure 8:
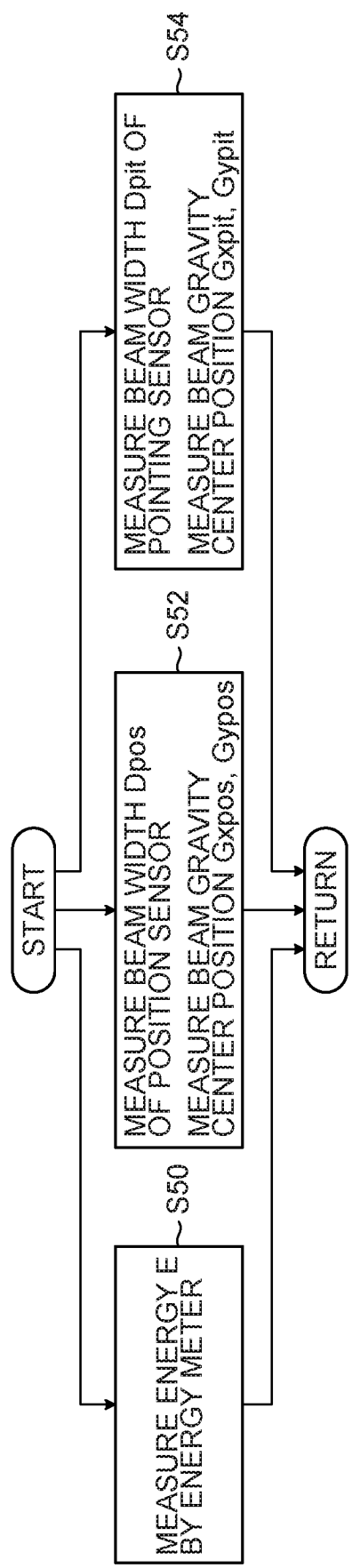
FIG. 8 is a flowchart illustrating a flow of an optical axis direction and passage position measurement subroutine illustrated in FIG. 7.

4.3.1.3 Description of Optical Axis Direction and Passage Position Measurement Subroutine FIG. 8 is a flowchart illustrating a flow of the optical axis direction and passage position measurement subroutine illustrated in FIG. 7. The measurement subroutine of FIG. 7 includes step S50, step S52, and step S54 of FIG. 8. At step S50, the amplification control unit 218C illustrated in FIG. 4 measures energy E for each parameter set.

Measurement of energy at step S50 of FIG. 8 may be performed by using an energy meter. Details of an energy meter will be described below. Measurement of energy may use configurations illustrated in FIGS. 23 to 25.

At step S52 of FIG. 8, the amplification control unit 218C illustrated in FIG. 4 measures a beam width Dpos and a gravity center position Gxpos and Gypos of the laser light to be measured for each parameter set, by using a position sensor. At step S54 of FIG. 8, the amplification control unit 218C illustrated in FIG. 4 measures a beam width Dpit and a gravity center position Gxpit and Gypit of the laser light to be measured for each parameter set, by using a direction sensor.

Figure 21:
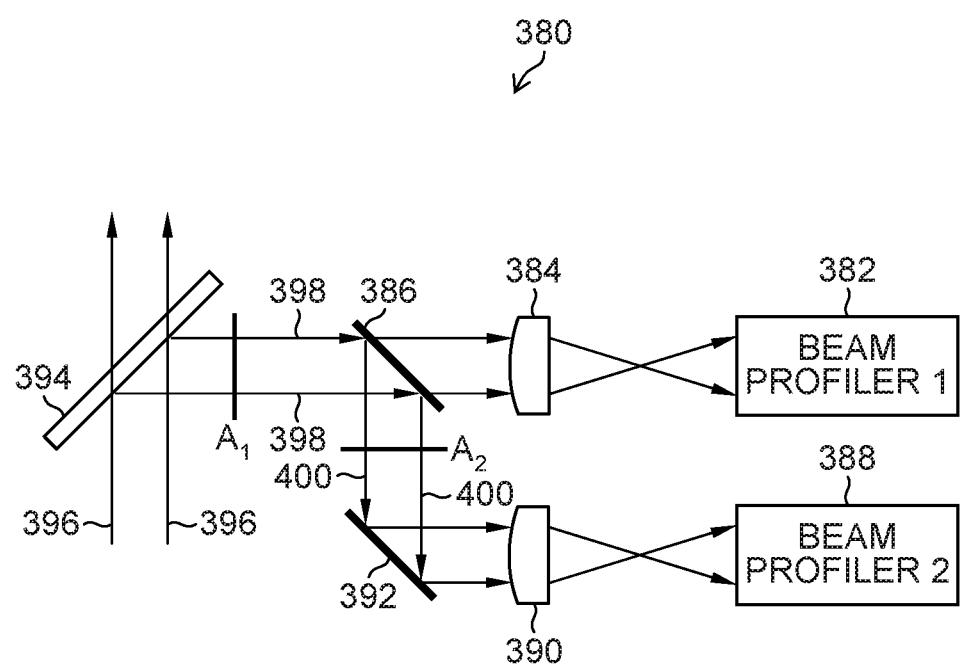
FIG. 21 is a diagram schematically illustrating a first exemplary configuration of a measurement unit applicable to a laser device according to the present embodiment.

As the direction sensor, a first beam profiler 382 illustrated in FIG. 21 may be used. As the position sensor, a second beam profiler 388 illustrated in FIG. 21 may be used. At step S52 of FIG. 8, a beam profile of the laser light to be measured may be acquired for each parameter set. Then, the beam width Dpos and the gravity center position Gxpos and Gypos of the laser light of each parameter set may be calculated from the obtained beam profile of each parameter set.

At step S54 of FIG. 8, a beam profile for each acquired parameter set may be acquired. Then, the beam width Dpit and the gravity center position Gxpit and Gypit of the laser light of each parameter set may be calculated from the beam profile of each acquired parameter set. When steps S50, S52 and S54 end, step S36 of FIG. 7 ends.

Figure 9:
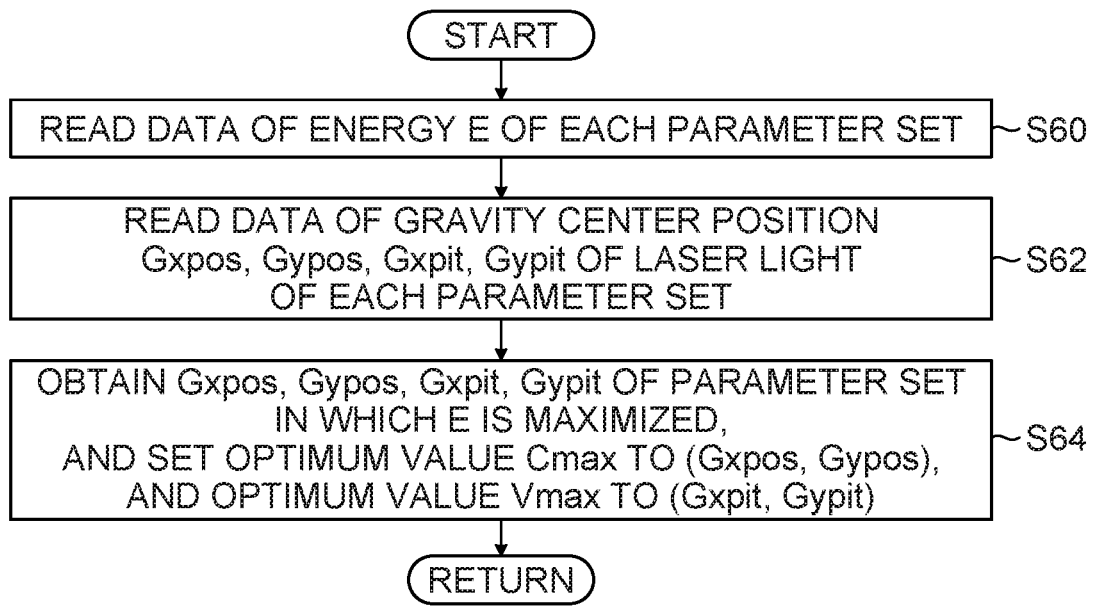
FIG. 9 is a flowchart illustrating a flow of an optical axis optimum direction and optimum passage position determination subroutine illustrated in FIG. 6.

4.3.1.4 Description of Optical Axis Optimum Direction and Optimum Passage Position Determination Subroutine FIG. 9 is a flowchart illustrating a flow of control of the optical axis optimum direction and optimum passage position determination subroutine illustrated in FIG. 6. At step S60 of FIG. 9, the amplification control unit 218C illustrated in FIG. 4 reads out data of the energy E of each parameter set. At step S62 of FIG. 9, the amplification control unit 218C illustrated in FIG. 4 reads out data of the gravity center position Gxpos, Gypos, Gxpit, and Gypit of the laser light for each parameter set.

At step S64 of FIG. 9, the amplification control unit 218C illustrated in FIG. 4 obtains a parameter set in which the energy E becomes maximum. Then, the gravity center position Gxpos, Gypos, Gxpit, and Gypit of the laser light of the parameter set, at which the energy E is maximized, is obtained.

Furthermore, an optimum value Cmax of the passage position of the optical axis of the laser light is set to (Gxpos, Gypos), and an optimum value Vmax of the direction of the optical axis of the laser light is set to (Gxpit, Gypit). When step S64 of FIG. 9 ends, the optical axis optimum direction and optimum passage position determination subroutine of FIG. 6 ends.

4.3.1.5 Description of Wavefront Scanning Subroutine

Figure 10:
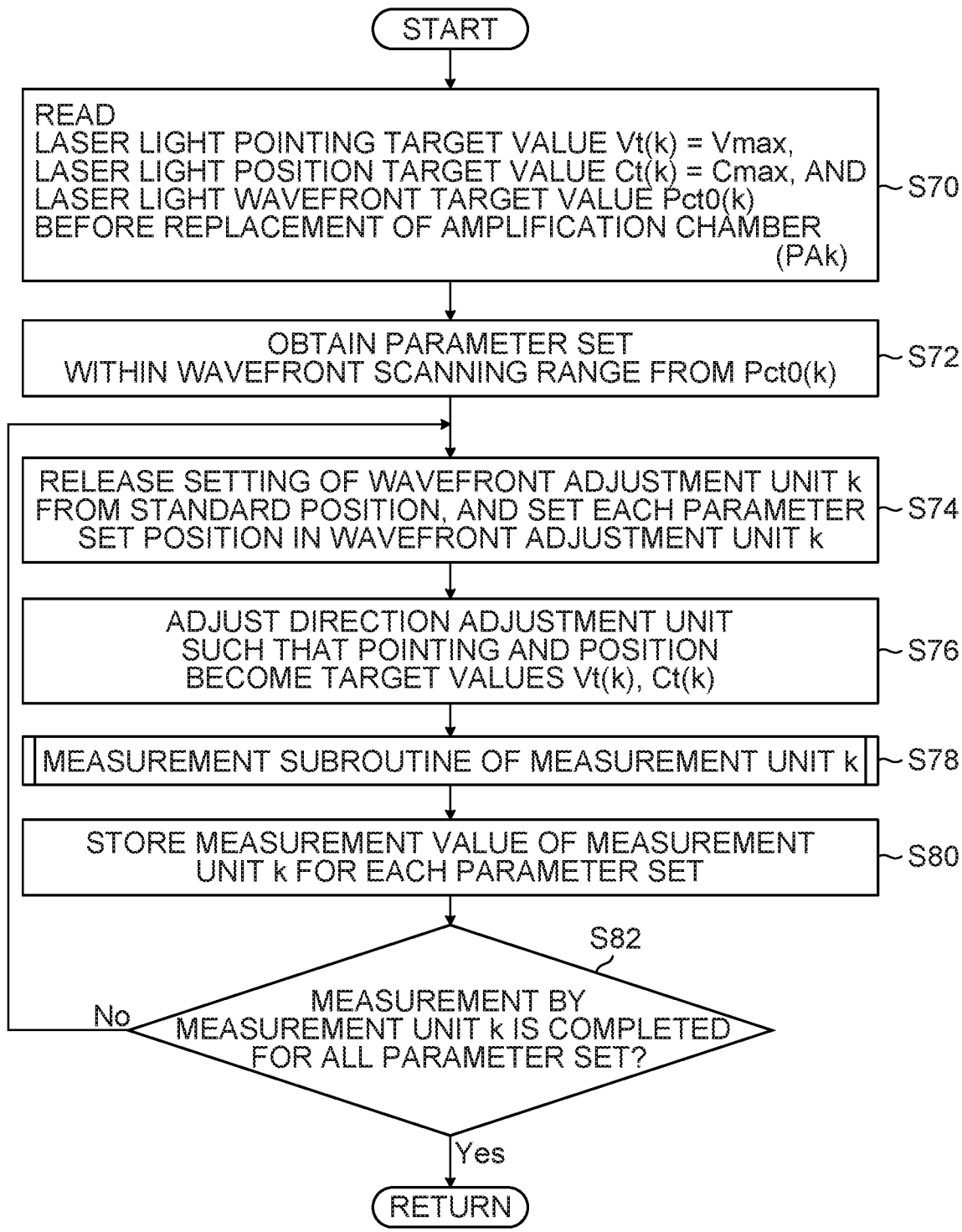
FIG. 10 is a flowchart illustrating a flow of a wavefront scanning subroutine illustrated in FIG. 6.

FIG. 10 is a flowchart illustrating a flow of the wavefront scanning subroutine illustrated in FIG. 6. At step S70 of FIG. 10, the amplification control unit 218C illustrated in FIG. 4 reads out the target value Vt(k) of the direction of the optical axis of the laser light, and the target value Ct(k) of the passage position of the optical axis of the laser light. Further, the amplification control unit 218C reads out the target value Pct0(k) of the wavefront of the laser light before the amplification chamber 214C is replaced.

The target value Vt(k) of the direction of the optical axis of the laser light, and the target value Ct(k) of the passage position of the optical axis of the laser light are determined at step S16 of FIG. 6. The value read out at step S30 of FIG. 7 may be used as the target value Pct0(k) of the wavefront of the laser light.

At step S72 of FIG. 10, the amplification control unit 218C illustrated in FIG. 4 obtains a parameter or a parameter set within a scanning range of the wavefront of the laser light, by using the target value Pct0(k) of the wavefront of the laser light. The scanning range of the wavefront of the laser light may be determined from values of beam widths Dpos and Dpit of the laser light before the amplification chamber 214C is replaced. When the configuration of the wavefront adjustment unit 210C is one illustrated in FIGS. 16 to 18, the scanning range of the wavefront of the laser light may be one-dimensional. In that case, the amplification control unit 218C obtains a parameter in the wavefront scanning range of the laser light.

At step S74 of FIG. 10, the amplification control unit 218C illustrated in FIG. 4 releases the setting of the wavefront adjustment unit 210C from the standard position, and sets the setting of the wavefront adjustment unit 210C to each parameter or each parameter set. The standard position is the set value in the operation before the amplification chamber 214C is replaced.

At step S76 of FIG. 10, the amplification control unit 218C illustrated in FIG. 4 adjusts the optical axis of the laser light made incident on the amplification chamber 214C according to the determined target value Vt(k) and the determined target value Ct(k) at step S16 of FIG. 6, with use of the first direction adjustment unit 212C.

At step S78 of FIG. 10, a measurement subroutine is performed. At step S78, the amplification control unit 218C illustrated in FIG. 4 measures energy E for each parameter or a parameter set, a beam width Dpit of the laser light acquired by using a direction sensor, and a beam width Dpos of the laser light acquired by using a position sensor. However, the energy E may not be measured at step S78.

At step S80 of FIG. 10, the amplification control unit 218C illustrated in FIG. 4 stores a measurement result obtained by using the measurement unit 216C illustrated in FIG. 4, for each parameter or parameter set. At step S82 of FIG. 10, the amplification control unit 218C illustrated in FIG. 4 determines whether or not the measurement using the measurement unit 216C is completed for every standard.

When the measurement using the measurement unit 216C illustrated in FIG. 4 is not completed for all parameters or all parameter sets, it is determined to be No at step S82 of FIG. 10. When it is determined to be No at step S82, the processing proceeds to step S74. Thereafter, the respective processes from step S74 to step S82 are repeated until it is determined to be Yes at step S82.

On the other hand, when the measurement using the measurement unit 216C illustrated in FIG. 4 is completed for all parameters or all parameter sets, it is determined to be Yes at step S82 of FIG. 10. When it is determined to be Yes at step S82, the wavefront scanning subroutine illustrated in FIG. 10 ends.

4.3.1.6 Description of Optimum Wavefront Determination Subroutine

Figure 11:
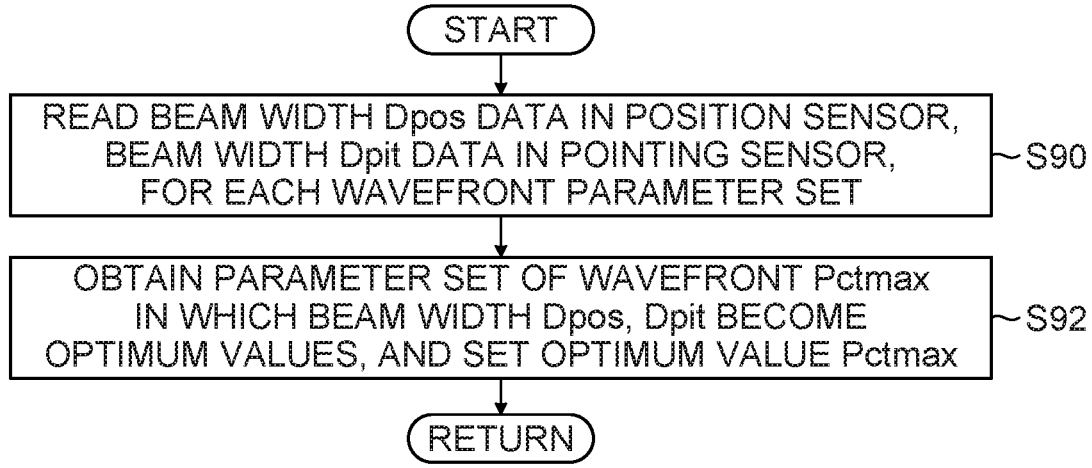
FIG. 11 is a flowchart illustrating a flow of an optimum wavefront determination subroutine illustrated in FIG. 6.

FIG. 11 is a flowchart illustrating a flow of the optimum wavefront determination subroutine illustrated in FIG. 6. At step S90 of FIG. 11, the beam width Dpit of the laser light acquired by using a direction sensor and the beam width Dpos of the laser light acquired by using a position sensor are read out for each parameter or parameter set.

At step S92, the amplification control unit 218C illustrated in FIG. 4 obtains a parameter or a parameter set in which the beam width Dpit of the laser light acquired by using a direction sensor and the beam width Dpos of the laser light acquired by using a position sensor become optimum. Then, the amplification control unit 218C sets a parameter or a parameter set stored in association with the optimum beam width Dpit and the optimum beam width Dpos, to be an optimum value Pctmax of the wavefront. When step S92 of FIG. 11 ends, the optimum wavefront determination subroutine ends.

4.3.2 Flow of Adjustment after Replacement of Wavefront Adjustment Unit

Figure 12:
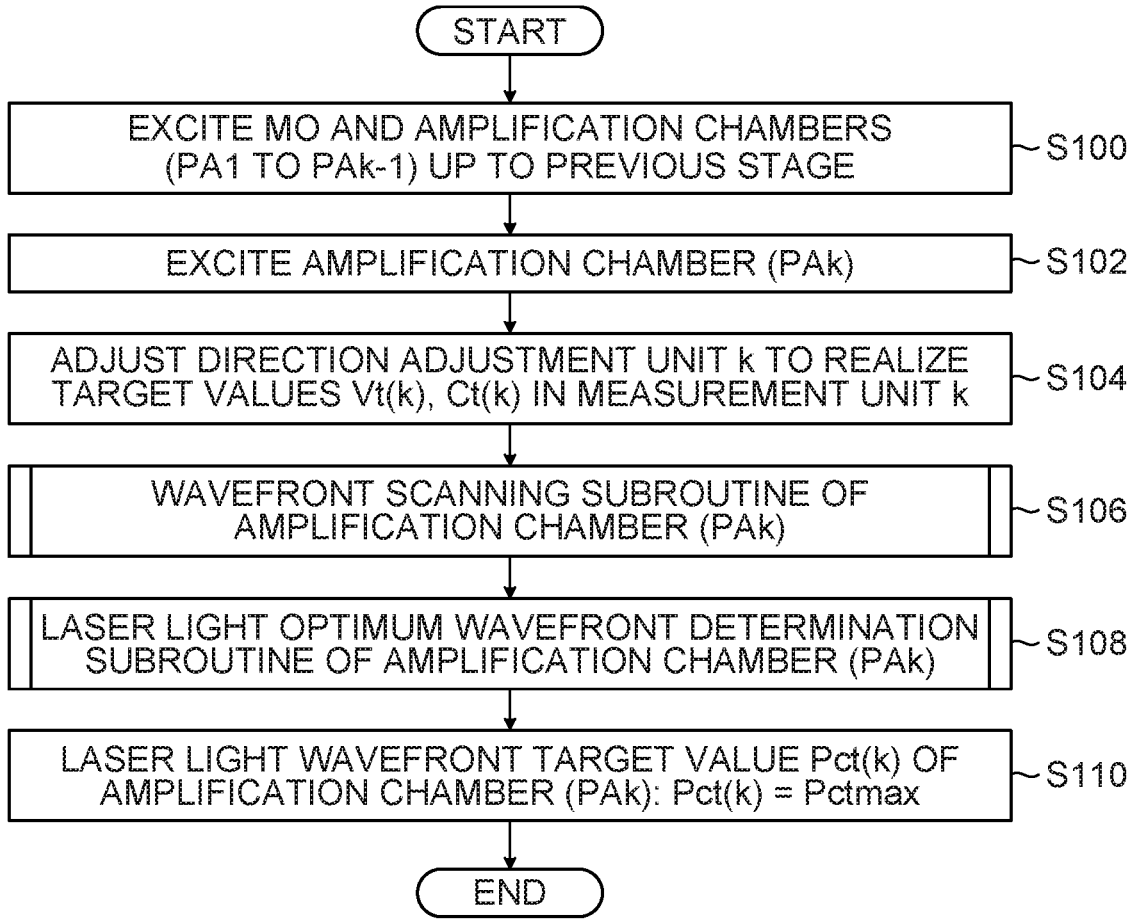
FIG. 12 is a flowchart illustrating a flow of adjustment when a wavefront adjustment unit is replaced.

FIG. 12 is a flowchart illustrating a flow of adjustment when a wavefront adjustment unit is replaced. At step S100 of FIG. 12, the laser oscillator 202 illustrated in FIG. 4 and the amplification chamber 214 up to the previous stage of the amplification chamber 214C are excited. At step S102 of FIG. 12, the amplification chamber 214C is excited.

At step S104 of FIG. 12, the amplification control unit 218C illustrated in FIG. 4 adjusts the direction of the optical axis of the laser light made incident on the amplification chamber 214C to the target value Vt(k), by using the first direction adjustment unit 212C. Further, at step S104 of FIG. 12, the amplification control unit 218C illustrated in FIG. 4 adjusts the passage position of the optical axis of the laser light made incident on the amplification chamber 214C to the target value Ct(k), by using the first direction adjustment unit 212C.

At step S104 of FIG. 12, the amplification control unit 218C illustrated in FIG. 4 excites the amplification chamber 214 up to the amplification chamber 214C, and measures the direction of the optical axis and the passage position of the optical axis of the laser light emitted from the amplification chamber 214C by using the measurement unit 216C. The amplification control unit 218C may control the first direction adjustment unit 212C so that the measurement result of the measurement unit 216C becomes the target value Vt(k) and the target value Ct(k).

The amplification control unit 218C may extract a difference between the measurement result of the direction of the optical axis of the laser light and the target value Vt(k). The amplification control unit 218C may extract a difference between the measurement result of the passage position of the optical axis of the laser light and the target value Ct(k).

The amplification control unit 218C may adjust the optical axis of the laser light by using the first direction adjustment unit 212C such that the difference between the measurement result of the direction of the optical axis of the laser light and the target value Vt(k) is reduced. The amplification control unit 218C may adjust the optical axis of the laser light by using the first direction adjustment unit 212C such that the difference between the measurement result of the passage position of the optical axis of the laser light and the target value Ct(k) is reduced.

At step S106 of FIG. 12, the amplification control unit 218C illustrated in FIG. 4 performs scanning of the wavefront of the laser light. At step S106 of FIG. 12, the amplification control unit 218C illustrated in FIG. 4 performs a wavefront scanning subroutine illustrated in FIG. 10. At step S108 of FIG. 12, the amplification control unit 218C illustrated in FIG. 4 determines an optimum value Pctmax of the wavefront of the laser light.

At step S108 of FIG. 12, the amplification control unit 218C illustrated in FIG. 4 performs the optimum wavefront determination subroutine illustrated in FIG. 11 to determine the optimum value Pctmax of the wavefront of the laser light. At step S110, the amplification control unit 218C illustrated in FIG. 4 sets the optimum value Pctmax of the wavefront of the laser light as the target value Pct(k) of the wavefront of the laser light. When step S110 ends, adjustment when the wavefront adjustment unit is replaced ends.

4.3.3 Flow of Adjustment after Replacement of Measurement Unit

Figure 13:
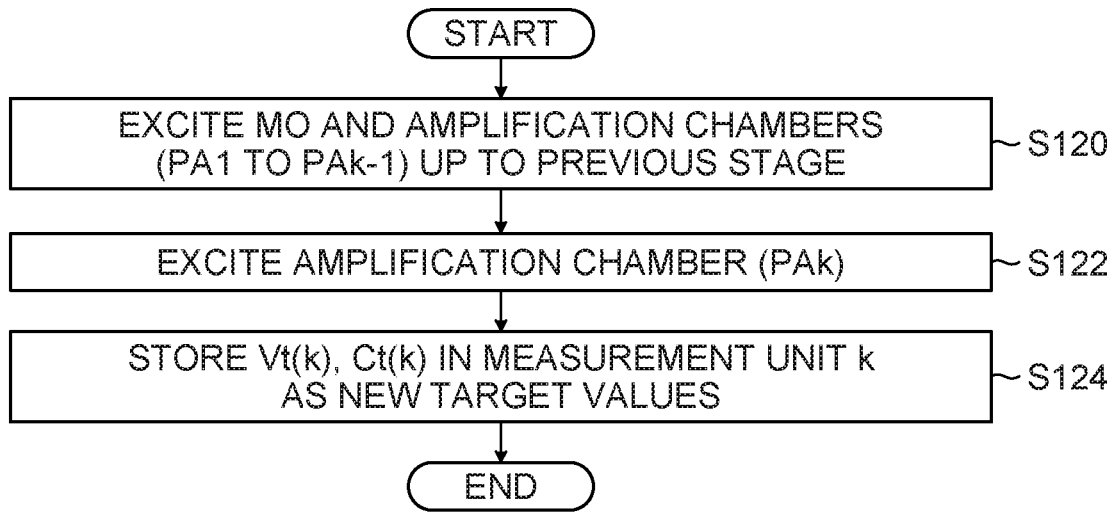
FIG. 13 is a flowchart illustrating a flow of adjustment when a measurement unit is replaced.

FIG. 13 is a flowchart illustrating a flow of adjustment when a measurement unit is replaced. At step S120, the amplification control unit 218C illustrated in FIG. 4 excites the laser oscillator 202 and the amplification chamber 214 up to the previous stage of the amplification chamber 214C. At step S122 of FIG. 13, the amplification control unit 218C illustrated in FIG. 4 excites the amplification chamber 214C.

At step S124 of FIG. 13, the amplification control unit 218C illustrated in FIG. 4 makes the laser light emitted from the amplification chamber 214C incident on the measurement unit 216C in a state where the amplification chamber 214C is excited. Then, measurement values measured by the replaced measurement unit 216C are stored as a new target value Vt(k) of the direction of the optical axis and a new target value Ct(k) of the passage position of the optical axis.

When step S124 of FIG. 13 ends, adjustment when the measurement unit is replaced ends.

4.3.4 Flow of Adjustment after Replacement of First Direction Adjustment Unit

Figure 14:
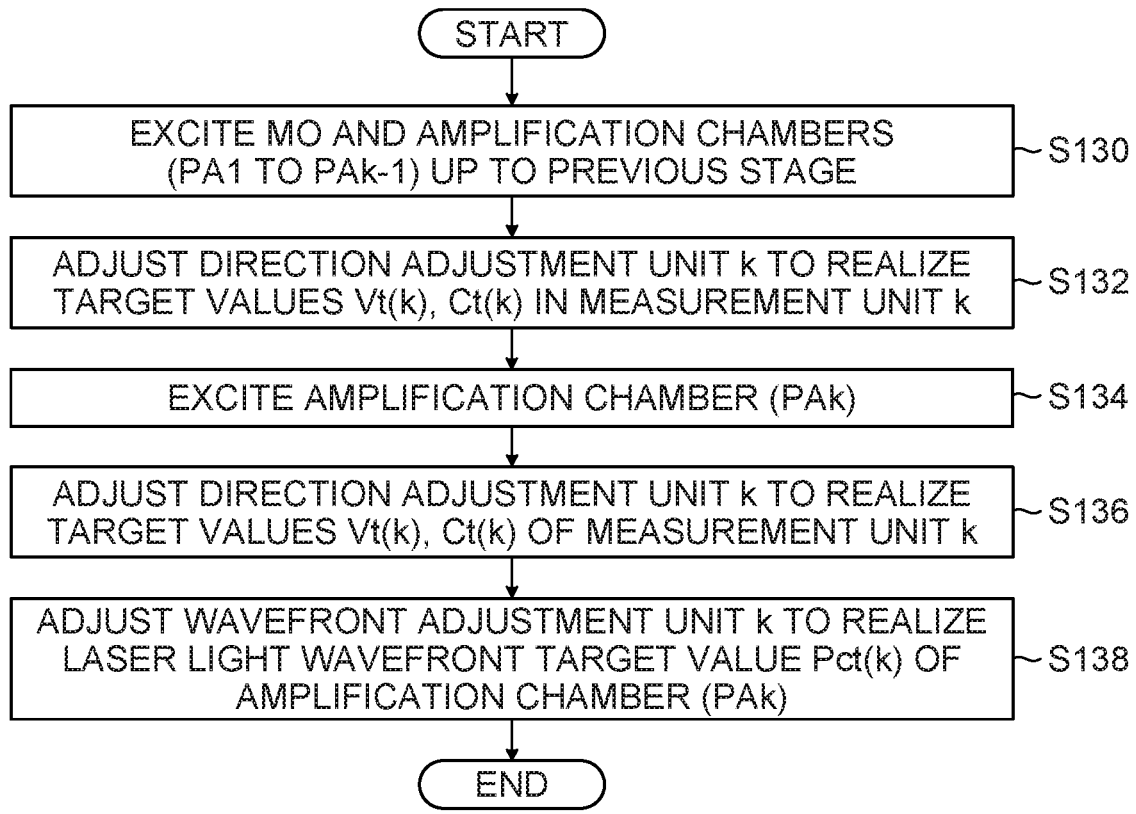
FIG. 14 is a flowchart illustrating a flow of adjustment when a first direction adjustment unit is replaced.

FIG. 14 is a flowchart illustrating a flow of adjustment when a first direction adjustment unit is replaced. At step S130, the amplification control unit 218C illustrated in FIG. 4 excites the laser oscillator 202 and the amplification chamber 214 up to the previous stage of the amplification chamber 214C.

At step S132 of FIG. 14, the amplification control unit 218C illustrated in FIG. 4 adjusts the optical axis of the laser light emitted from the amplification chamber 214C by using the first direction adjustment unit 212C after the replacement, in a state where the amplification chamber 214 up to the previous stage of the amplification chamber 214C is excited. Adjustment of the optical axis of the laser light is the same as that of step S104 of FIG. 12. Therefore, the description is not repeated here.

At step S134 of FIG. 14, the amplification control unit 218C illustrated in FIG. 4 excites the amplification chamber 214C. At step S136 of FIG. 14, the amplification control unit 218C illustrated in FIG. 4 adjusts the optical axis of the laser light to be made incident on the amplification chamber 214C by using the first direction adjustment unit 212C after the replacement, in a state where the amplification chamber 214C is excited. Adjustment of the optical axis of the laser light is the same as that of step S104 of FIG. 12. Therefore, the description is not repeated here.

At step S138 of FIG. 14, the amplification control unit 218C illustrated in FIG. 4 adjusts the wavefront of the laser light to be made incident on the amplification chamber 214C. At step S138 of FIG. 14, the amplification control unit 218C illustrated in FIG. 4 may measure the wavefront of the laser light emitted from the amplification chamber 214C by using the measurement unit 216C, in a state where the amplification chamber 214C is excited. The amplification control unit 218C may acquire a measurement result.

The amplification control unit 218C may extract a difference between the measurement result and the target value Pct(k) of the wavefront. The amplification control unit 218C may adjust the wavefront of the laser light by using the wavefront adjustment unit 210C such that the difference between the measurement result of the wavefront of the laser light and the target value Pct(k) is reduced. When step S138 ends, adjustment when the first direction adjustment unit 212C is replaced ends.

Figure 15:
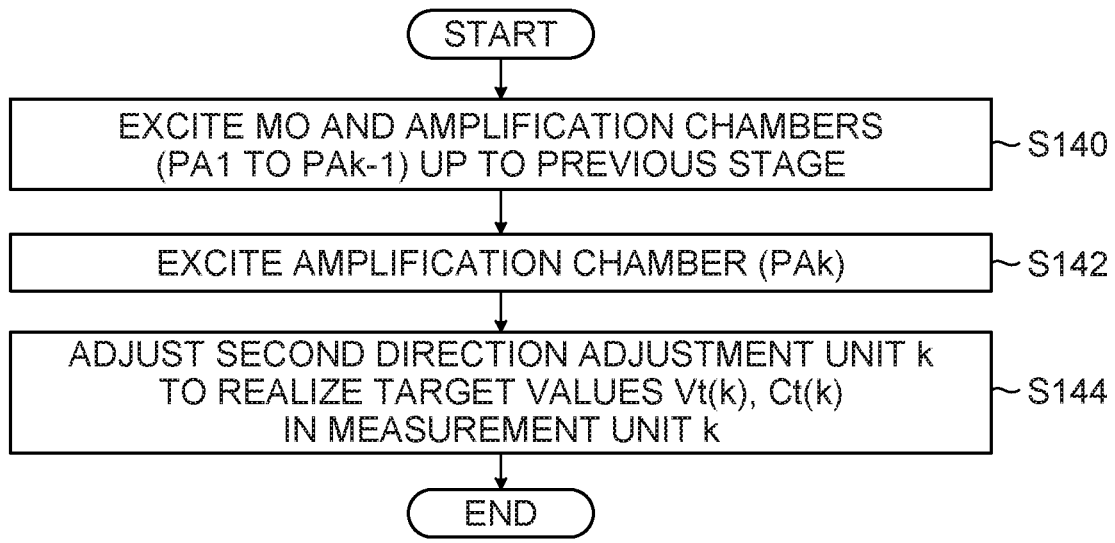
FIG. 15 is a flowchart illustrating a flow of adjustment when a second direction adjustment unit is replaced.

4.3.5 Flow of Adjustment after Replacement of Second Direction Adjustment Unit FIG. 15 is a flowchart illustrating a flow of adjustment when the second direction adjustment unit is replaced. At step S140, the amplification control unit 218C illustrated in FIG. 4 excites the laser oscillator 202 and the amplification chamber 214 up to the previous stage of the amplification chamber 214C. At step S142 of FIG. 15, the amplification control unit 218C illustrated in FIG. 4 excites the amplification chamber 214C.

At step S144 of FIG. 15, the amplification control unit 218C adjusts the second direction adjustment unit 215C such that measurement values measured by the measurement unit 216C become the target value Vt(k) of the direction of the optical axis of the laser light and the target value Ct(k) of the passage position of the optical axis of the laser light before the second direction adjustment unit 215C is replaced.

When step S144 ends, adjustment when the second direction adjustment unit 215C is replaced ends.

4.4 Exemplary Configuration of Wavefront Adjustment Unit

4.4.1 First Exemplary Configuration

4.4.1.1 Configuration

Figure 16:
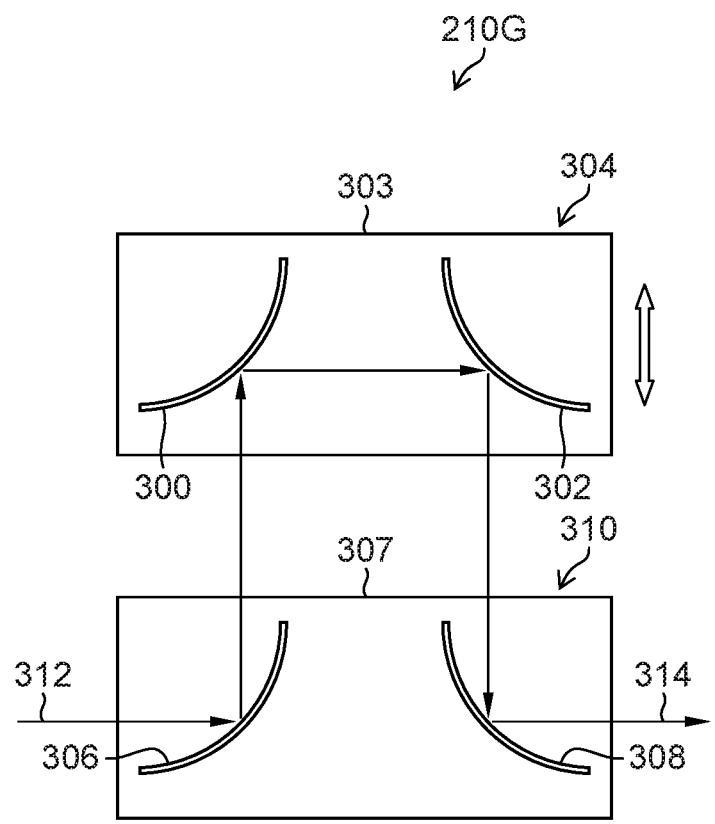
FIG. 16 is a diagram schematically illustrating a first exemplary configuration of a wavefront adjustment unit applicable to a laser device according to the present embodiment.

FIG. 16 is a diagram schematically illustrating a first exemplary configuration of a wavefront adjustment unit applicable to a laser device according to the present embodiment. Hereinafter, an example in which a beam width is used as a parameter of a wavefront of the laser light will be described. As a parameter of a wavefront of the laser light, beam divergence may be used. A curvature of the wavefront of the laser light may be obtained from the beam divergence.

A wavefront adjustment unit 210G illustrated in FIG. 16 includes a first mirror pair 304 having a first mirror 300 and a second mirror 302, and a second mirror pair 310 having a third mirror 306 and a fourth mirror 308.

The first mirror 300 and second mirror 302 are fixed to a movable plate 303. The third mirror 306 and the fourth mirror 308 are fixed to a fixed plate 307. The movable plate 303 is connected with an actuator not illustrated. Operation of the actuator not illustrated is controlled with use of the amplification control unit 218 illustrated in FIG. 4.

The movable plate 303 illustrated in FIG. 16 is configured such that a distance between the first mirror pair 304 and the second mirror pair 310 is adjustable. An arrow line illustrated in FIG. 16 represents a moving direction in the case of moving the first mirror pair 304.

It is also possible to fix the first mirror 300 and the second mirror 302 to a fixed plate, and fix the third mirror 306 and the fourth mirror 308 to a movable plate. Meanwhile, it is also possible to fix the first mirror 300 and the second mirror 302 to a movable plate, and fix the third mirror 306 and the fourth mirror 308 to a movable plate.

An off-axis parabolic convex mirror is used as the first mirror 300 and second mirror 302 in the wavefront adjustment unit 210G illustrated in FIG. 16. An off-axis parabolic concave mirror is used as the third mirror 306 and fourth mirror 308 in the wavefront adjustment unit 210G illustrated in FIG. 16.

An arrow line denoted by a reference numeral 312 in FIG. 16 represents laser light made incident on the wavefront adjustment unit 210G. An arrow line denoted by a reference numeral 314 in FIG. 16 represents laser light emitted from the wavefront adjustment unit 210G.

4.4.1.2 Operation

In the case of adjusting the wavefront, an electrical signal representing an operation command of an actuator is transmitted from the amplification control unit 218 illustrated in FIG. 4 to a driving unit of the actuator not illustrated. The actuator operates based on the operation command.

When the actuator operates and widens the distance between the first mirror pair 304 and the second mirror pair 310 relatively, it is possible to widen the beam width of the laser light. When the distance between the first mirror pair 304 and the second mirror pair 310 is narrowed relatively, it is possible to narrow the beam width of the laser light.

4.4.2 Second Exemplary Configuration

Figure 17:
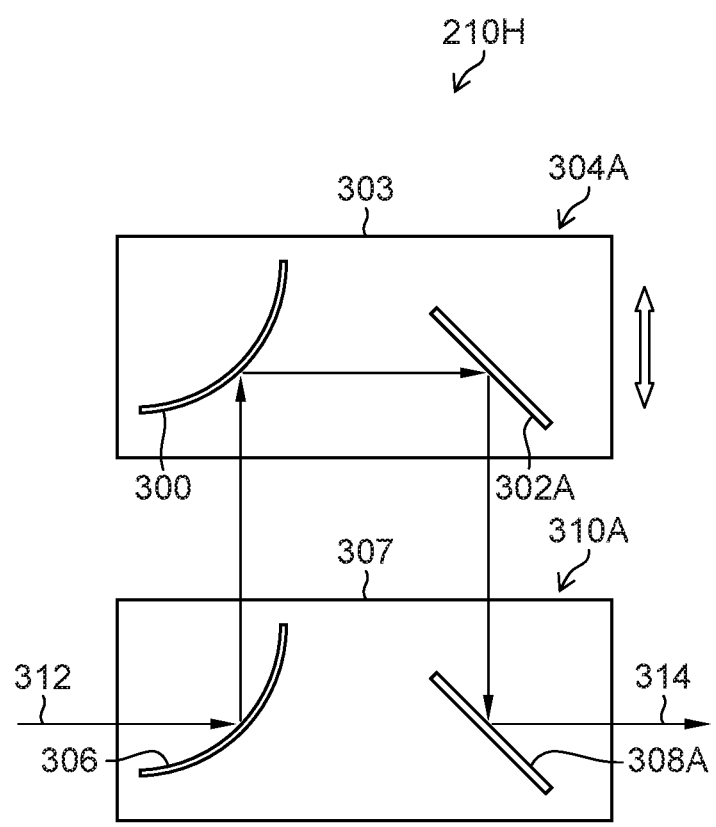
FIG. 17 is a diagram schematically illustrating a second exemplary configuration of a wavefront adjustment unit applicable to a laser device according to the present embodiment.

FIG. 17 is a diagram schematically illustrating a second exemplary configuration of a wavefront adjustment unit applicable to a laser device according to the present embodiment. A wavefront adjustment unit 210H illustrated in FIG. 17 includes a third mirror pair 304A illustrated in FIG. 17, instead of the first mirror pair 304 illustrated in FIG. 16. The wavefront adjustment unit 210H includes a fourth mirror pair 310A illustrated in FIG. 17, instead of the second mirror pair 310 illustrated in FIG. 16.

The third mirror pair 304A has a fifth mirror 302A illustrated in FIG. 17, instead of the second mirror 302 illustrated in FIG. 16. The fourth mirror pair 310A has a sixth mirror 308A illustrated in FIG. 17, instead of the fourth mirror 308 illustrated in FIG. 16. As the fifth mirror 302A and the sixth mirror 308A, a flat mirror is used.

4.4.3 Third Exemplary Configuration

Figure 18:
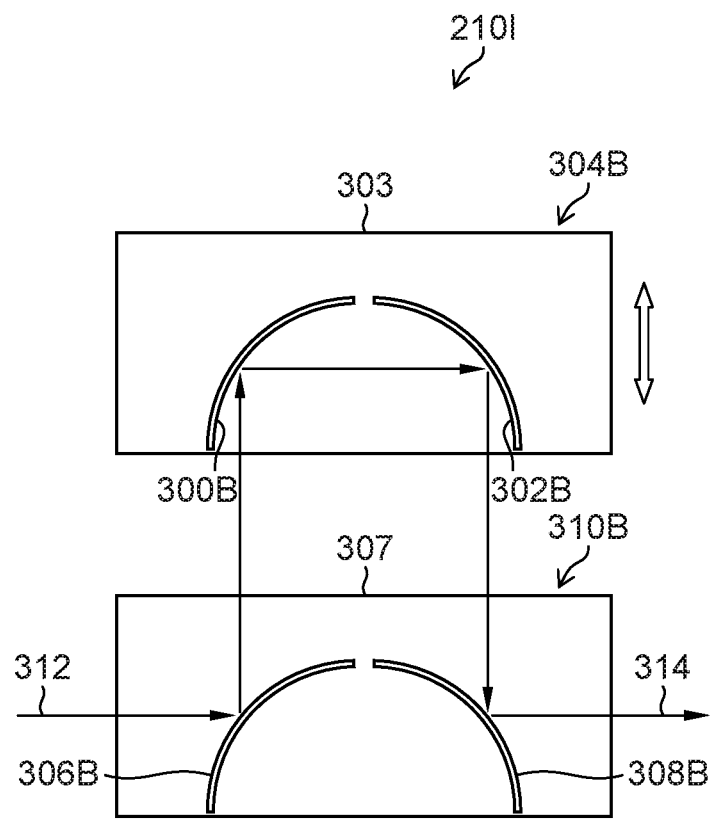
FIG. 18 is a diagram schematically illustrating a third exemplary configuration of a wavefront adjustment unit applicable to a laser device according to the present embodiment.

FIG. 18 is a diagram schematically illustrating a third exemplary configuration of a wavefront adjustment unit applicable to a laser device according to the present embodiment. A wavefront adjustment unit 210I illustrated in FIG. 18 includes a fifth mirror pair 304B illustrated in FIG. 18, instead of the first mirror pair 304 illustrated in FIG. 16. The wavefront adjustment unit 210I includes a sixth mirror pair 310B illustrated in FIG. 18, instead of the second mirror pair 310 illustrated in FIG. 16.

The fifth mirror pair 304B has a seventh mirror 300B illustrated in FIG. 18, instead of the first mirror 300 illustrated in FIG. 16. Further, the fifth mirror pair 304B has an eighth mirror 302B illustrated in FIG. 18, instead of the second mirror 302 illustrated in FIG. 16. An off-axis parabolic concave mirror is used as the seventh mirror 300B and the eighth mirror 302B.

The sixth mirror pair 310B has a ninth mirror 306B illustrated in FIG. 18, instead of the third mirror 306 illustrated in FIG. 16. Further, the sixth mirror pair 310B has a tenth mirror 308B illustrated in FIG. 18, instead of the fourth mirror 308 illustrated in FIG. 16. As the ninth mirror 306B and the tenth mirror 308B, an off-axis parabolic convex mirror is used.

4.4.4 Fourth Exemplary Configuration

4.4.4.1 Configuration

Figure 19:
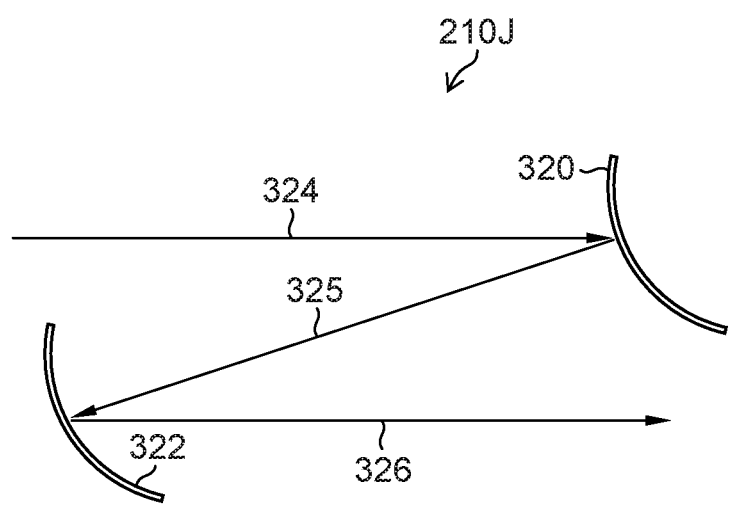
FIG. 19 is a diagram schematically illustrating a fourth exemplary configuration of a wavefront adjustment unit applicable to a laser device according to the present embodiment.

FIG. 19 is a diagram schematically illustrating a fourth exemplary configuration of a wavefront adjustment unit applicable to a laser device according to the present embodiment. A wavefront adjustment unit 210J illustrated in FIG. 19 includes an eleventh mirror 320 and a twelfth mirror 322.

A convex mirror is used as the eleventh mirror 320. A flat mirror may be used as the eleventh mirror 320. A variable curvature mirror is used as the twelfth mirror 322. The twelfth mirror 322 includes an actuator not illustrated. Operation of the actuator not illustrated is controlled with use of the amplification control unit 218 illustrated in FIG. 4.

The actuator may be operated by electric energy applied, or may be operated by a gas pressure or a liquid pressure applied.

4.4.4.2 Operation

The laser light 324 made incident on the eleventh mirror 320 is reflected by the eleventh mirror 320 and is made incident on the twelfth mirror 322. The laser light 325 made incident on the twelfth mirror 322 is reflected by the twelfth mirror 322.

Regarding the laser light 326 reflected by the twelfth mirror 322, the beam width can be changed by changing the surface shape of the twelfth mirror 322. The surface shape of the twelfth mirror 322 can be changeable by operating the actuator not illustrated.

In the case of adjusting the beam width as adjustment of the wavefront, an electric signal representing an operation command of the actuator is transmitted from the amplification control unit 218 illustrated in FIG. 4 to a driving unit of the actuator. The actuator operates based on the operation command.

Due to operation of the actuator, the surface shape of the twelfth mirror 322 in which a curvature variable mirror is used can be changed. The beam width of the laser light 326 reflected by the twelfth mirror 322 is adjusted.

4.5 Exemplary Configuration of Direction Adjustment Unit

4.5.1 Configuration

Figure 20:
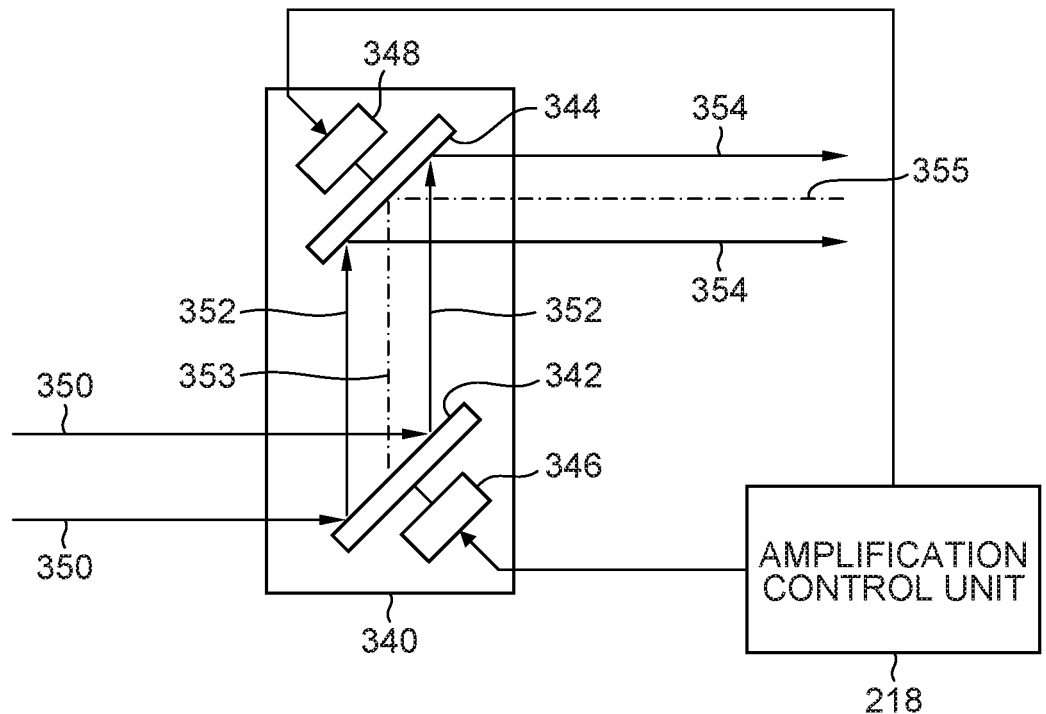
FIG. 20 is a diagram schematically illustrating a configuration of a direction adjustment unit applicable to a laser device according to the present embodiment.

FIG. 20 is a diagram schematically illustrating a configuration of a direction adjustment unit applicable to a laser device according to the present embodiment. A direction adjustment unit 340 illustrated in FIG. 20 is applicable to the first direction adjustment unit 212 and the second direction adjustment unit 215 illustrated in FIG. 4.

The direction adjustment unit 340 illustrated in FIG. 20 includes a first high reflective mirror 342, a second high reflective mirror 344, a first actuator 346, and a second actuator 348. The first actuator 346 is connected with the first high-reflective mirror 342. The second actuator 348 is connected with the second high-reflective mirror 344.

When the first actuator 346 is operated, an angle of the first high-reflective mirror 342 can be changed. When the second actuator 348 is operated, an angle of the second high-reflective mirror 344 can be changed. Operation of the first actuator 346 and the second actuator 348 is controlled with use of the amplification control unit 218.

4.5.2 Operation

Laser light 350 made incident on the direction adjustment unit 340 is made incident on the first high-reflective mirror 342 and is reflected by the first high-reflective mirror 342. Laser light 352 reflected by the first high-reflective mirror 342 is made incident on the second high-reflective mirror 344 and is reflected by the second high-reflective mirror 344. Laser light 354 reflected by the second high reflective mirror 344 is emitted from the direction adjustment unit 340.

When the first actuator 346 is operated to make the angle of the first high-reflective mirror 342 changeable, it is possible to change the optical axis 353 of the laser light 352 reflected by the first high-reflective mirror 342.

When the second actuator 348 is operated to make the angle of the second high-reflective mirror 344 changeable, it is possible to change the optical axis 355 of the laser light 354 reflected by the second high-reflective mirror 344.

The optical axis of the laser light emitted from the direction adjustment unit 340 can be adjusted by adjusting at least one of the angle of the first high-reflective mirror 342 or the angle of the second high-reflective mirror 344.

It is possible to adjust the optical axis of the laser light to the target optical axis of the laser light by measuring the optical axis of the laser light by using the measurement unit 216 illustrated in FIG. 4 and operating at least one of the first actuator 346 and the second actuator 348 based on the measurement result.

4.6 Exemplary Configuration of Measurement Unit

4.6.1 First Exemplary Configuration

4.6.1.1 Configuration

FIG. 21 is a diagram schematically illustrating a first exemplary configuration of a measurement unit applicable to a laser device according to the present embodiment. A measurement unit 380 illustrated in FIG. 21 is applicable to the measurement unit 216 illustrated in FIG. 4. The same applies to a second exemplary configuration described below.

The measurement unit 380 illustrated in FIG. 21 includes a first beam profiler 382, a first transfer optical system 384, and a first beam splitter 386. Further, the measurement unit 380 includes a second beam profiler 388, a second transfer optical system 390, a third high reflective mirror 392, and a second beam splitter 394.

A line sensor may be used as the first beam profiler 382 and the second beam profiler 388. A CCD camera may be used as the first beam profiler 382 and the second beam profiler 388.

CCD is abbreviation for charge coupled device. Further, in FIG. 21, the first beam profiler 382 is described as a beam profiler 1, and the second beam profiler 388 is described as a beam profiler 2. The same applies to FIG. 22.

The second beam splitter 394 is disposed on the optical path of the laser light 396 to be made incident on the measurement unit 380. The first beam splitter 386 is disposed on the optical path of first sample light 398. The first sample light 398 is laser light for measurement reflected by the second beam splitter 394.

The third high reflective mirror 392 is disposed on the optical path of second sample light 400. The second sample light 400 is laser light for measurement reflected by the first beam splitter 386.

The first transfer optical system 384 is disposed on the optical path of the first sample light 398 having passed through the first beam splitter 386. The second transfer optical system 390 is disposed on the optical path of the second sample light 400 reflected by the third high reflective mirror 392.

4.6.1.2 Operation

The measurement unit 380 illustrated in FIG. 21 obtains beam profiles at a point A1 on the optical path of the first sample light 398 and a point A2 on the optical path of the second sample light 400.

The first sample light 398 having passed through the first beam splitter 386 enters the first beam profiler 382 via the first transfer optical system 384. The first transfer optical system 384 transfers the beam profile at the point A1 on the optical path of the first sample light 398, to the light receiving surface of the first beam profiler 382. The first beam profiler 382 acquires the beam profile at the point A1.

The second sample light 400 having been reflected by the first beam splitter 386 is reflected by the third high reflective mirror 392, and enters the second beam profiler 388 via the second transfer optical system 390.

The second transfer optical system 390 transfers the beam profile at the point A2 on the optical path of the second sample light 400, to the light receiving surface of the second beam profiler 388. The second beam profiler 388 acquires the beam profile at the point A2.

The first beam profiler 382 may acquire the intensity distribution of the first sample light 398 at the point A1 as a beam profile. The second beam profiler 388 may acquire the intensity distribution of the second sample light 400 at the point A2 as a beam profile.

Measurement results measured by using the measurement unit 380 may be transmitted to the amplification control unit 218 illustrated in FIG. 4. The amplification control unit 218 may acquire the gravity position Gxpos, Gypos, Gxpit, and Gypit of the laser light 396, from the profile at the point A1 and the profile at the point A2 illustrated in FIG. 21.

The amplification control unit 218 illustrated in FIG. 4 may acquire the beam width Dpos and Dpit of the laser light 396 from either the profile at the point A1 or the profile at the point A2 illustrated in FIG. 21. A publicly known method is applicable to derivation of the optical axis of the laser light and derivation of the wavefront of the laser light using a beam profile.

4.6.2 Second Exemplary Configuration 4.6.2.1 Configuration

Figure 22:
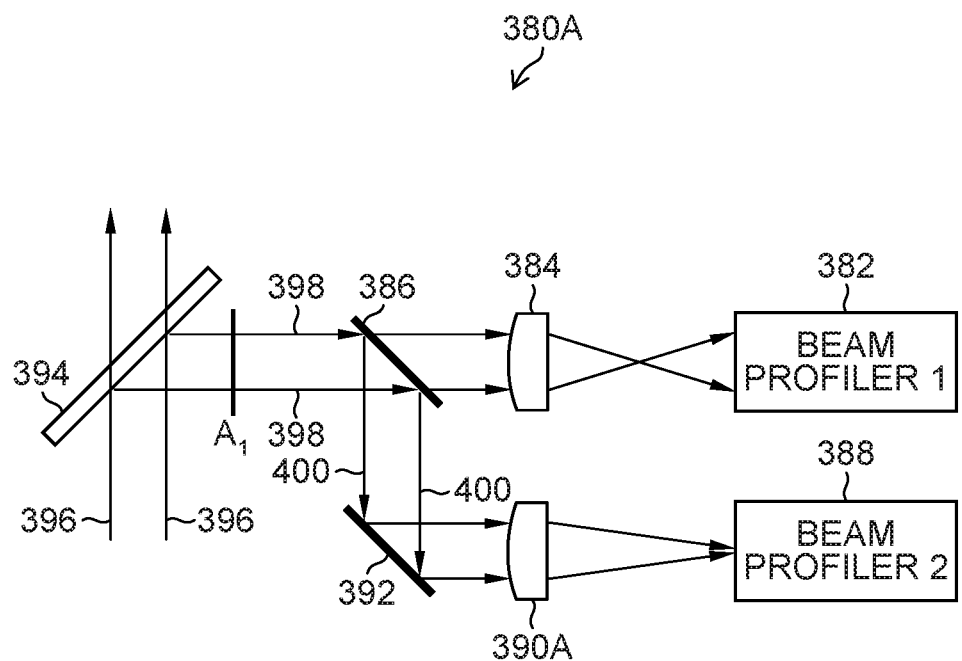
FIG. 22 is a diagram schematically illustrating a second exemplary configuration of a measurement unit applicable to a laser device according to the present embodiment.

FIG. 22 is a diagram schematically illustrating a second exemplary configuration of a measurement unit applicable to a laser device according to the present embodiment. A measurement unit 380A illustrated in FIG. 22 includes a first condensing lens 390A instead of the second transfer optical system 390 in the measurement unit 380 illustrated in FIG. 21.

4.6.2.2 Operation

From a beam profile acquired with use of the first beam profiler 382 illustrated in FIG. 22, a gravity center position Gxpos and Gypos of the first sample light 398 and the beam width Dpos of the laser light 396 may be acquired.

A gravity center position Gxpit and Gypit of the second sample light 400 may be acquired from a beam profile acquired with use of the second beam profiler 388 illustrated in FIG. 22.

4.7 Exemplary Configuration of Energy Meter 4.7.1 First Exemplary Configuration

Figure 23:
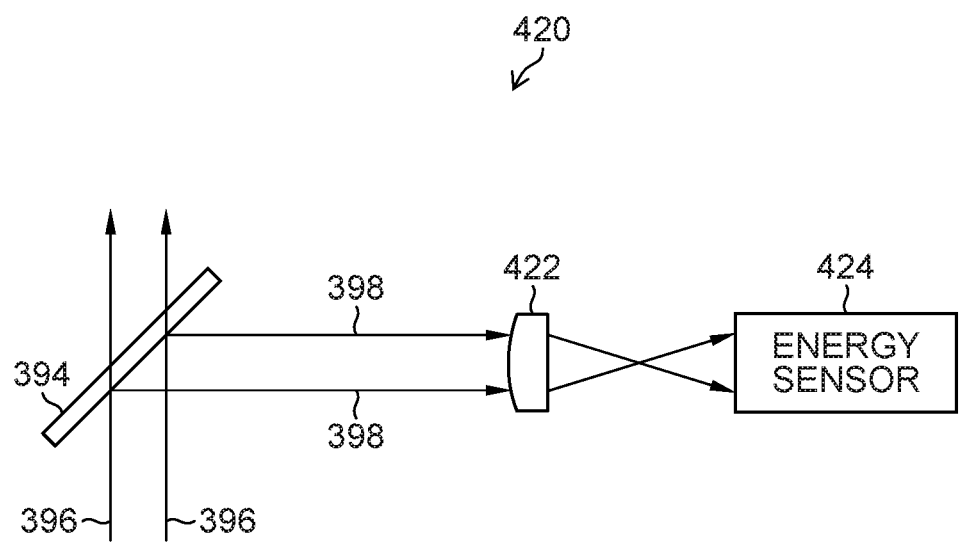
FIG. 23 is a diagram schematically illustrating a first exemplary configuration of an energy meter applicable to a laser device according to the present embodiment.

FIG. 23 is a diagram schematically illustrating a first exemplary configuration of an energy meter applicable to a laser device according to the present embodiment. An energy meter 420 illustrated in FIG. 23 includes a second condensing lens 422 and an energy sensor 424.

The second condensing lens 422 is disposed on an optical path of the first sample light 398. The energy sensor 424 is disposed on the optical path of the first sample light 398 condensed by the second condensing lens 422. The energy sensor 424 is not necessarily disposed at a focal position of the second condensing lens 422.

The energy sensor 424 detects energy of the first sample light 398 condensed by using the second condensing lens 422. A photodiode may be used as the energy sensor 424.

4.7.2 Second Exemplary Configuration

Figure 24:
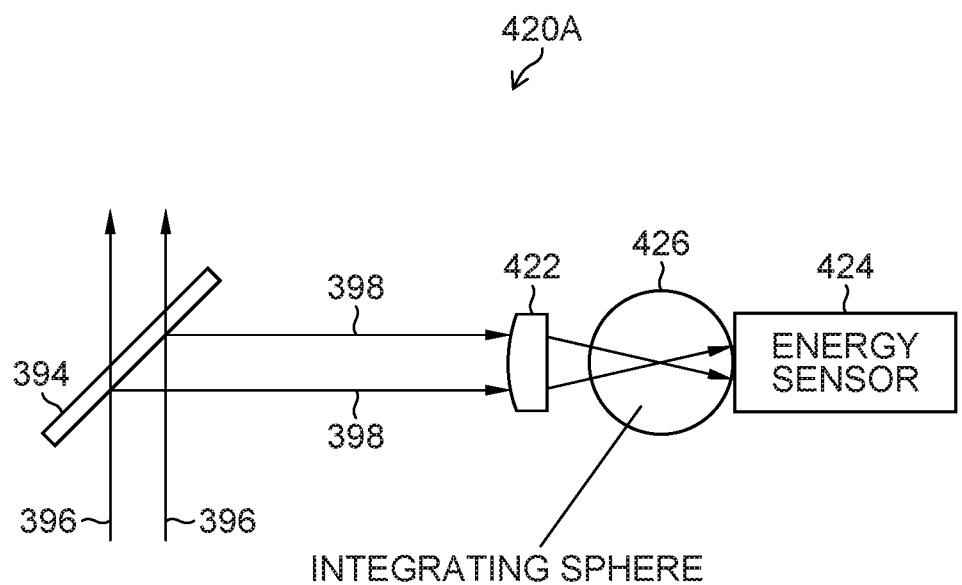
FIG. 24 is a diagram schematically illustrating a second exemplary configuration of an energy meter applicable to a laser device according to the present embodiment.

FIG. 24 is a diagram schematically illustrating a second exemplary configuration of an energy meter applicable to a laser device according to the present embodiment. An energy meter 420A illustrated in FIG. 24 includes an integrating sphere 426 on the incident side of the energy sensor 424 in the energy meter 420 illustrated in FIG. 23.

The integrating sphere 426 illustrated in FIG. 24 is provided with an opening on the incident side not illustrated, and an opening on the emission side not illustrated. The inner wall of the integrating sphere 426 may be made of a light scattering material having a high reflectance. The integrating sphere 426 may scatter the first sample light 398 made incident from the opening on the incident side, and emit uniform first sample light 398 from the opening on the emission side.

In the energy meter 420A illustrated in FIG. 24, the first sample light 398 condensed by using the second condensing lens 422 is made incident on the energy sensor 424 via the integrating sphere 426. The energy sensor 424 condenses light by using the second condensing lens 422, and detects energy of the first sample light 398 made uniform by using the integrating sphere 426.

4.7.3 Third Exemplary Configuration

Figure 25:
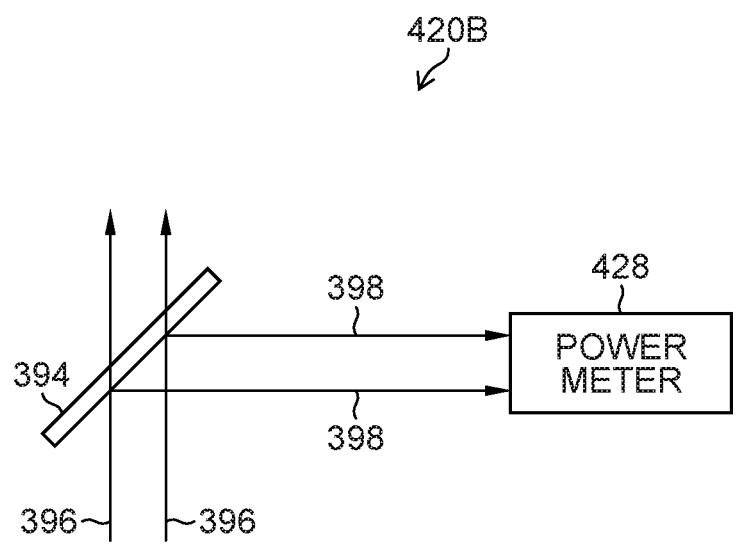
FIG. 25 is a diagram schematically illustrating a third exemplary configuration of an energy meter applicable to a laser device according to the present embodiment.

FIG. 25 is a diagram schematically illustrating a third exemplary configuration of an energy meter applicable to a laser device according to the present embodiment. An energy meter 420B illustrated in FIG. 25 includes a power meter 428 instead of the second condensing lens 422 and the energy sensor 424 in the energy meter 420 illustrated in FIG. 23.

4.8 Effect

The emission side of the amplification chamber 214 has the second direction adjustment unit 215. Thereby, when the amplification chamber 214 is replaced, the optical axis of laser light emitted from the replaced amplification chamber is adjusted to conform to an optimum optical axis of the amplification chamber disposed on the latter stage, with use of the second direction adjustment unit 215.

Therefore, adjustment of the optical axis in the amplification unit disposed in the latter stage of the replaced amplification chamber 214 is not required. Further, it is possible to reduce the adjustment time when the amplification chamber 214 is replaced, and it is possible to reduce the down time of the EUV device accompanying replacement of the amplification chamber.

When the amplification chamber 214 is replaced, the target value of the optical axis before the amplification chamber is replaced is kept in the adjustment of the optical axis using the second direction adjustment unit. Therefore, it is possible to restore the optical axis before replacement.

When the amplification chamber 214 is replaced, the wavefront is adjusted to an optimum wavefront in the amplification chamber 214 after the replacement in the wavefront adjustment using the wavefront adjustment unit 210. Further, the optical axis is adjusted to an optimum optical axis of the amplification chamber 214 after the replacement, in the optical axis adjustment using the first direction adjustment unit 212. Thereby, laser light having an optimum wavefront and an optimum optical axis can be made incident on the amplification chamber 214 after the replacement.

In the embodiment described above, while examples of application of a laser light to an EUV generation system have been shown, the laser device according to the present embodiment is applicable to applications other than an EUV generation system.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to be included". A term "have" should be construed as "not limited to that described to be held". Moreover, an indefinite article "a/an" described in the present description and in the accompanying claims should be construed to mean "at least one" or "one or more".

What is claimed is:

1. A laser device for an extreme ultraviolet light generation system, comprising:
   amplification units configured to amplify laser light emitted from a laser oscillator; and
   an amplification control unit configured to control the amplification units, each of the amplification units including:
      an incident-side optical adjustment unit on which laser light is made incident, the incident-side optical adjustment unit including a wavefront adjustment unit configured to adjust a wavefront of the laser light, and a first direction adjustment unit configured to adjust an optical axis of the laser light;
      an amplifier disposed downstream the incident-side optical adjustment unit in a transmission direction of the laser light, the amplifier being configured to amplify the laser light emitted from the incident-side optical adjustment unit;
      an emission-side optical adjustment unit disposed downstream the amplifier in the transmission direction of the laser light, the emission-side optical adjustment unit including a second direction adjustment unit configured to adjust an optical axis of laser light emitted from the amplifier, the second direction adjustment unit being disposed at a position where the laser light emitted from the amplifier is directly made incident thereon; and
      a measurement unit disposed downstream the emission-side optical adjustment unit in the transmission direction of the laser light, the measurement unit being configured to measure laser light emitted from the emission-side optical adjustment unit and acquire information on an optical axis, a wavefront and energy of the laser light, the measurement unit being disposed at a position where the laser light emitted from the second direction adjustment unit is directly made incident on the measurement unit,
   the amplification control unit controlling the incident-side optical adjustment unit and the emission-side optical adjustment unit, based on a measurement result of the measurement unit, and
   when the amplifier is replaced, the amplification control unit in response being configured to:
      perform a first control of controlling the first direction adjustment unit such that energy of the laser light emitted from the amplifier after replacement increases;
      determine a target value of the optimal optical axis and optimal wavefront of the laser light made incident on the amplification chamber, based on the first control for the first direction adjustment unit;
      set the target value to the first direction adjustment unit; and then
      perform a second control of controlling the second direction adjustment unit such that the optical axis of the laser light emitted from the amplifier after replacement approaches the optical axis before the amplifier is replaced, the optical axis before the amplifier is replaced being an optical axis of an amplification unit of a latter stage before the amplifier is replaced.

2. The laser device according to claim 1, wherein
   when the amplifier is replaced, the amplification control unit controls the wavefront adjustment unit such that a wavefront of the laser light emitted from the amplifier after replacement becomes a predetermined wavefront.

3. The laser device according to claim 1, wherein
   the measurement unit measures a direction of the optical axis and a passage position of the optical axis of the laser light to be measured.

4. The laser device according to claim 1, wherein
   when the amplifier is replaced, the amplification control unit controls the first direction adjustment unit to adjust the optical axis of the laser light, and then controls the wavefront adjustment unit to adjust a wavefront of the laser light with the optical axis thereof adjusted.

5. The laser device according to claim 1, wherein
   when the amplifier is replaced, the amplification control unit controls the first direction adjustment unit to adjust the optical axis of the laser light, and then controls the second direction adjustment unit such that an optical axis to be measured by the measurement unit approaches the optical axis before the amplifier is replaced.

6. The laser device according to claim 1, wherein
   the second direction adjustment unit is disposed at a position on which the laser light emitted from the amplifier is directly made incident, and the measurement unit is disposed at a position on which laser light emitted from the second direction adjustment unit is directly made incident.

7. The laser device according to claim 1, wherein
   the amplification units are arranged in series in the transmission direction of the laser light.

8. An extreme ultraviolet light source system for generating extreme ultraviolet light by irradiating a target substance with laser light to make the target substance into plasma, the system comprising:
   amplification units configured to amplify laser light emitted from a laser oscillator;
   an amplification control unit configured to control the amplification units; and
   an extreme ultraviolet light generation chamber on which laser light emitted from the amplification units is made incident and in which extreme ultraviolet light is generated with use of the laser light,
   each of the amplification units including:
      an incident-side optical adjustment unit on which laser light is made incident, the incident-side optical adjustment unit including a wavefront adjustment unit configured to adjust a wavefront of the laser light, and a first direction adjustment unit configured to adjust an optical axis of the laser light;
      an amplifier disposed downstream the incident-side optical adjustment unit in a transmission direction of the laser light, the amplifier being configured to amplify the laser light emitted from the incident-side optical adjustment unit;

an emission-side optical adjustment unit disposed downstream the amplifier in the transmission direction of the laser light, the emission-side optical adjustment unit including a second direction adjustment unit configured to adjust an optical axis of laser light emitted from the amplifier, the second direction adjustment unit being disposed at a position where the laser light emitted from the amplifier is directly made incident thereon; and a measurement unit disposed downstream the emission-side optical adjustment unit in the transmission direction of the laser light, the measurement unit being configured to measure laser light emitted from the emission-side optical adjustment unit and acquire information on an optical axis, a wavefront and energy of the laser light, the measurement unit being disposed at a position where the laser light emitted from the second direction adjustment unit is directly made incident on the measurement unit, the amplification control unit controlling the incident-side optical adjustment unit and the emission-side optical adjustment unit, based on a measurement result of the measurement unit, and when the amplifier is replaced, the amplification control unit in response being configured to:

perform a first control of controlling the first direction adjustment unit such that energy of the laser light emitted from the amplifier after replacement increases;

determine a target value of the optimal optical axis and optimal wavefront of the laser light made incident on the amplification chamber, based on the first control for the first direction adjustment unit;

set the target value to the first direction adjustment unit; and then perform a second control of controlling the second direction adjustment unit such that the optical axis of the laser light emitted from the amplifier after replacement approaches the optical axis before the amplifier is replaced, the optical axis before the amplifier is replaced being an optical axis of an amplification unit of a latter stage before the amplifier is replaced.

9. The extreme ultraviolet light source system according to claim 8, wherein when the amplifier is replaced, the amplification control unit controls the wavefront adjustment unit such that a wavefront of the laser light emitted from the amplifier after replacement becomes a predetermined wavefront.

10. The extreme ultraviolet light source system according to claim 8, wherein the measurement unit measures a direction of the optical axis and a passage position of the optical axis of the laser light to be measured.

11. The extreme ultraviolet light source system according to claim 8, wherein when the amplifier is replaced, the amplification control unit controls the first direction adjustment unit to adjust the optical axis of the laser light, and then controls the wavefront adjustment unit to adjust a wavefront of the laser light with the optical axis thereof adjusted.

12. The extreme ultraviolet light source system according to claim 8, wherein when the amplifier is replaced, the amplification control unit controls the first direction adjustment unit to adjust the optical axis of the laser light, and then controls the second direction adjustment unit such that an optical axis to be measured by the measurement unit approaches the optical axis before the amplifier is replaced.

13. The extreme ultraviolet light source system according to claim 8, wherein the second direction adjustment unit is disposed at a position on which the laser light emitted from the amplifier is directly made incident, and the measurement unit is disposed at a position on which laser light emitted from the second direction adjustment unit is directly made incident.

14. The extreme ultraviolet light source system according to claim 8, wherein the amplification units are arranged in series in the transmission direction of the laser light.

* * * * *